US012796277B2

(12) United States Patent
Lee

(10) Patent No.: US 12,796,277 B2
(45) Date of Patent: Nov. 10, 2026

(54) DISPLAY DEVICE

(71) Applicant: Samsung Display Co., Ltd., Yongin-Si (KR)

(72) Inventor: Seonuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 18/945,519

(22) Filed: Nov. 13, 2024

(65) Prior Publication Data

US 2025/0318396 A1 Oct. 9, 2025

(30) Foreign Application Priority Data

Apr. 5, 2024 (KR) ........................ 10-2024-0046956

(51) Int. Cl.
*H10K 59/38* (2023.01)
*H10K 59/122* (2023.01)

(52) U.S. Cl.
CPC ........... *H10K 59/38* (2023.02); *H10K 59/122* (2023.02)

(58) Field of Classification Search
CPC .. H10K 59/38; H10K 59/122; H10H 20/8312; H10H 20/857; H10H 20/8514; H10W 90/00
See application file for complete search history.

(56) References Cited

U.S. PATENT DOCUMENTS

| | | | | |
|---|---|---|---|---|
| 2008/0036367 | A1 | 2/2008 | Eida et al. | |
| 2020/0150492 | A1 | 5/2020 | Lee et al. | |
| 2023/0100355 | A1 | 3/2023 | Hwang et al. | |
| 2023/0217772 | A1 | 7/2023 | Lee et al. | |
| 2024/0244915 | A1 * | 7/2024 | Shin | H10K 59/122 |
| 2024/0407198 | A1 * | 12/2024 | Lim | H10K 59/352 |
| 2025/0221112 | A1 * | 7/2025 | Shin | H10H 20/8512 |

FOREIGN PATENT DOCUMENTS

| | | | |
|---|---|---|---|
| JP | 2021-128226 | A | 9/2021 |
| KR | 10-2007-0049172 | A | 5/2007 |
| KR | 10-2016-0017373 | A | 2/2016 |
| KR | 10-2021-0043776 | A | 4/2021 |
| KR | 10-2023-0104502 | A | 7/2023 |

* cited by examiner

*Primary Examiner* — Anne M Hines
(74) *Attorney, Agent, or Firm* — Innovation Counsel LLP

(57) ABSTRACT

A display device is provided which comprises a display panel including a first light-emitting element, a second light-emitting element, and a third light-emitting element, and a color conversion panel disposed on the display panel. The color conversion panel may include an upper substrate comprising a first light-transmitting area, a color filter layer, and a bank comprising a first bank opening which overlaps the first light-transmitting area. The first light-transmitting area may include a 1st-1 light-transmitting area and 1st-2 light-transmitting area which is spaced from the 1st-1 light-transmitting area in a first direction. The first bank opening may include a 1st-1 bank opening overlapping the 1st-1 light-transmitting area, a 1st-2 bank opening overlapping the 1st-2 light-transmitting area, a 1st-3 bank opening connecting the 1st-1 bank opening and the 1st-2 bank opening.

20 Claims, 13 Drawing Sheets

DISPLAY DEVICE

CROSS-REFERENCE TO RELATED APPLICATION

This application is based on and claims priority under 35 U.S.C. § 119 to Korean Patent Application No. 10-2024-0046956, filed on Apr. 5, 2024, in the Korean Intellectual Property Office, the disclosure of which is incorporated by reference herein in its entirety.

BACKGROUND

1. Field

The present disclosure relates to a device, and more particularly, to a display device.

2. Description of the Related Art

Electronic devices based on mobility have been widely used. Recently, in addition to small electronic devices such as mobile phones, tablet personal computers (PCs) have been widely used as mobile electronic devices.

In order to support various functions, these mobile electronic devices include a display device to provide visual information such as images or video to a user. Recently, as the sizes of other components for driving a display device have been decreased, the area occupied by display devices in electronic devices has gradually increased, and a structure that may be bent by a certain angle from a flat state has been developed.

SUMMARY

The present disclosure includes a display device that reduces a coloring phenomenon, simplifies a manufacturing process, and decreases a manufacturing time.

However, these features are illustrative, and problems to be solved by the disclosure are not limited thereto.

Additional aspects will be set forth in the description which follows and will be apparent from the description.

According to an embodiment of the present disclosure, a display device comprises a display panel including a first light-emitting element, a second light-emitting element, and a third light-emitting element, and a color conversion panel disposed on the display panel, wherein the color conversion panel may include an upper substrate including a first light-transmitting area overlapping the first light-emitting element, a second light-transmitting area overlapping the second light-emitting element, and a third light-transmitting area overlapping the third light-emitting element, a color filter layer disposed under the upper substrate and including a first color filter overlapping the first light-transmitting area, a second color filter overlapping the second light-transmitting area, and a third color filter overlapping the third light-transmitting area, and a bank disposed under the color filter layer and including a first bank opening overlapping the first light-transmitting area, a second bank opening overlapping the second light-transmitting area, and a third bank opening overlapping the third light-transmitting area. The first light-transmitting area may include a 1st-1 light-transmitting area and a 1st-2 light-transmitting area spaced apart from the 1st-1 light-transmitting area in a first direction, and the first bank opening may include a 1st-1 bank opening overlapping the 1st-1 light-transmitting area, a 1st-2 bank opening overlapping the 1st-2 light-transmitting area, and a 1st-3 bank opening connecting the 1st-1 bank opening and the 1st-2 bank opening to each other. The 1st-3 bank opening may have a greater length in a second direction crossing the first direction than a length of at least one of the 1st-1 bank opening and the 1st-2 bank opening in the second direction.

The second light-transmitting area may include a 2nd-1 light-transmitting area, and a 2nd-2 light-transmitting area spaced apart from the 2nd-1 light-transmitting area in the first direction, and the third light-emitting area may include a 3rd-1 light-transmitting area, and a 3rd-2 light-transmitting area spaced apart from the 3rd-1 light-transmitting area in the first direction.

A center of each of the 1st-1 light-transmitting area, the 2nd-1 light-transmitting area and the 3rd-1 light-transmitting area may be disposed on a first center line that is a virtual straight line extending in the second direction.

The third bank opening may include a 3rd-1 bank opening overlapping the 3rd-1 light-transmitting area, and a 3rd-2 bank opening overlapping the 3rd-2 light-transmitting area and spaced apart from the 3rd-1 bank opening in the first direction.

The third light-emitting area may be an area through which blue light transmits.

Each of the first light-transmitting area and the second light-transmitting area may be an area through which one of red light and green light transmits.

The color conversion panel may further include a first cover part disposed in the 1st-3 bank opening, extending in the second direction, and connected to the bank.

The first cover part and the bank may include the same material.

The first light-transmitting area may further include a 1st-3 light-transmitting area spaced apart from the 1st-2 light-transmitting area in the first direction, and a 1st-4 light-transmitting area spaced apart from the 1st-3 light-transmitting area in the first direction, and the first bank opening may further include a 1st-4 bank opening overlapping the 1st-3 light-transmitting area, a 1st-5 bank opening overlapping the 1st-4 light-transmitting area, and a 1st-6 bank opening connecting the 1st-4 bank opening and the 1st-5 bank opening to each other.

The first bank opening may further include a 1st-7 bank opening connecting the 1st-2 bank opening and the 1st-4 bank opening to each other.

The 1st-7 bank opening may have a greater length in the second direction than a length of at least one of the 1st-2 bank opening and the 1st-4 bank opening in the second direction.

The first light-emitting element, the second light-emitting element, the third light-emitting element may emit light of the same color.

The color conversion panel may further include a functional layer comprising a first quantum dot layer disposed in the first bank opening, a second quantum dot layer disposed in the second bank opening, and a transmission layer disposed in the third bank opening.

According to an embodiment of the present disclosure, a display device includes a display panel including a first light-emitting element and a color conversion panel disposed on the display panel, wherein the color conversion panel may include an upper substrate including a first light-transmitting area overlapping the first light-emitting element, a color filter layer disposed under the upper substrate and including a first color filter overlapping the first light-transmitting area, and a bank disposed under the color filter layer and including a first bank opening overlapping the first light-transmitting area. The first light-transmitting area may include a 1st-1 light-transmitting area and a 1st-2 light-transmitting area spaced apart from the 1st-1 light-transmitting area in a first direction, and the first bank opening may include a 1st-1 bank opening overlapping the 1st-1 light-transmitting area, a 1st-2 bank opening overlapping the 1st-2 light-transmitting area, and 1st-3 bank opening connecting the 1st-1 bank opening and the 1st-2 bank opening to each other. The 1st-3 bank opening may have a greater length in a second direction crossing the first direction than a length of at least one of the 1st-1 bank opening and the 1st-2 bank opening in the second direction.

The color conversion panel may further include a first cover part disposed in the 1st-3 bank opening, extending in the second direction, and connected to the bank.

The first cover part and the bank may include the same material.

The first light-transmitting area may further include a 1st-3 light-transmitting area spaced apart from the 1st-2 light-transmitting area in the first direction, and 1st-4 light-transmitting area spaced from the 1st-3 light-transmitting area, and the first bank opening may further include a 1st-4 bank opening overlapping the 1st-3 light-transmitting area, a 1st-5 bank opening overlapping the 1st-4 light-transmitting area, and a 1st-6 bank opening connecting the 1st-4 bank opening and the 1st-5 bank opening to each other.

The first bank opening may further include a 1st-7 bank opening connecting the 1st-2 bank opening and the 1st-4 bank opening to each other.

The 1st-7 bank opening may have a greater length in the second direction than a length of at least one of the 1st-2 bank opening and the 1st-4 bank opening in the second direction.

The color conversion panel may further include a functional layer including a first quantum dot layer disposed in the first bank opening.

Other aspects, features, and advantages of the present disclosure other than the above description will be clear from the following descriptions with accompanying drawings.

BRIEF DESCRIPTION OF THE DRAWINGS

The above and other aspects, features, and advantages of the present disclosure will become more apparent from the following description taken in conjunction with the accompanying drawings.

DETAILED DESCRIPTION

Figure 1:
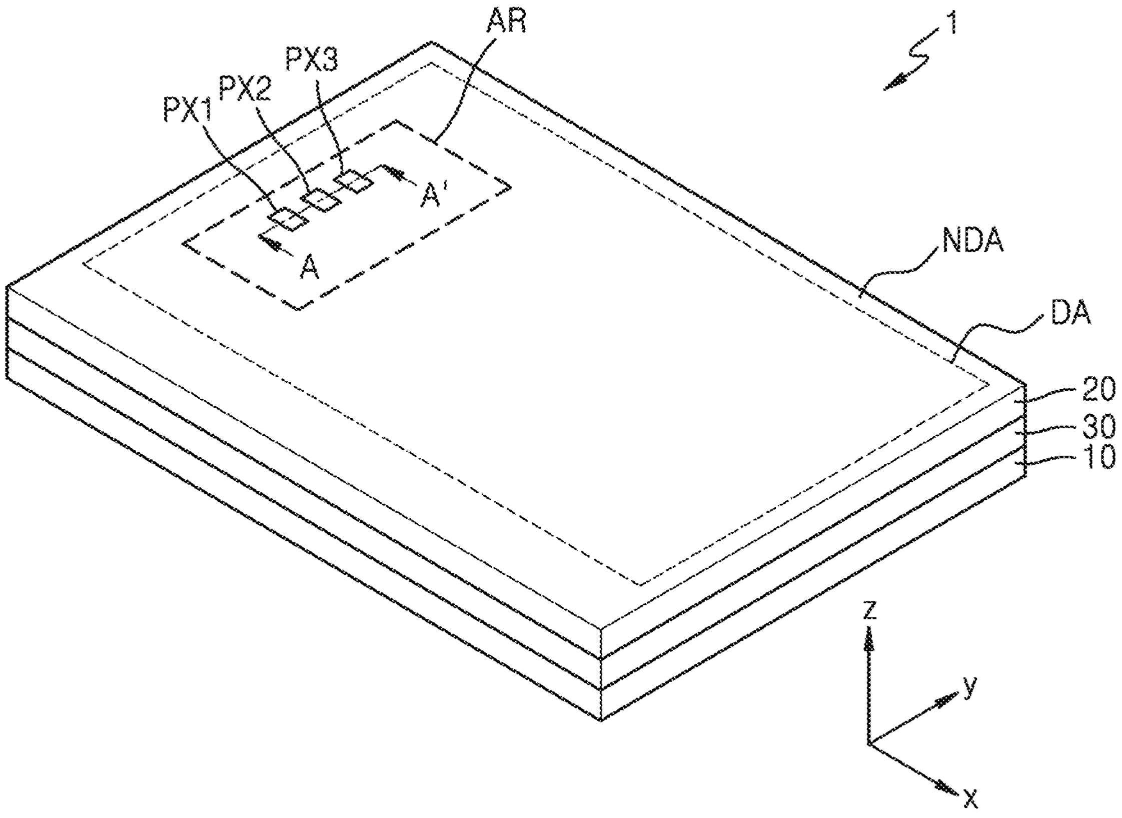
FIG. 1 is a perspective view schematically illustrating a display device according to an embodiment.

Hereinafter, specific embodiments of the present disclosure are explained in detail with reference to the accompanying drawings. Like numerals refer to like elements throughout. In this regard, embodiments of the present disclosure may have different forms and should not be construed as being limited to the descriptions set forth herein. Accordingly, the embodiments are merely described below, by referring to the drawing, to explain aspects of the present description. As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As the present disclosure allows for various changes and can have numerous embodiments, specific embodiments will be illustrated in the drawings and described in the detailed description. Effects and features of the present disclosure, as well as a method of achieving them will be apparent with reference to embodiments described below in detail in conjunction with the drawings. However, it should be noted that the present disclosure is not limited to the embodiments disclosed herein, but may be implemented in a variety of forms.

Hereinafter, embodiments will be described in detail with reference to the accompanying drawings, and the same or corresponding components are denoted by the same reference numerals, and the same reference numerals are assigned and redundant explanations will be omitted.

In the following embodiments, the terms of the first and second, etc. were used for the purpose of distinguishing one element from other elements, and not in a limiting sense.

In the following embodiments, the singular expression includes a plurality of expressions unless the context is clearly different.

In the following embodiments, the terms such as "comprising," "including," or "having" indicate that the features or elements described in the specification are present, but do not preclude the possibility that one or more other features or elements may be added.

In the following embodiments, when a portion such as a layer, a region, an element or the like is "on" another portion, it includes not only the case where the portion is directly on top of the other portion, but also the case where another layer, region, or element is interposed therebetween.

In the drawings, for convenience of explanation, the sizes of elements may be exaggerated or reduced. For example, since the size and thickness of each elements shown in the drawings are arbitrarily indicated for convenience of explanation, the disclosure is not necessarily limited thereto.

In the following embodiments, the x-axis, the y-axis, and the z-axis are not limited to three axes on a rectangular coordinate system, and may be interpreted in a broad sense. For example, the x-axis, the y-axis, and the z-axis may be perpendicular to each other, or may refer to different directions that are not orthogonal to each other.

In the case where some embodiments may be implemented in the present specification, a specific process order may be performed differently from the order described. For example, two processes described in succession may be substantially performed at the same time, or in an opposite order to the described order.

FIG. 1 is a perspective view schematically illustrating a display device 1 according to an embodiment.

Referring to FIG. 1, the display device 1 may display an image. The display device 1 may provide an image through a plurality of sub-pixels arranged in a display area DA. Each of the plurality of sub-pixels of the display device 1 may be an area in which light of a certain color may be emitted. The display device 1 may display an image by using light emitted from the plurality of sub-pixels. For example, each sub-pixel may emit red, green or blue light. In another example, each sub-pixel may emit red, green, blue or white light.

The non-display area NDA may surround at least a part of the display area DA. In an example, the non-display area NDA may surround the display area DA entirely. The non-display area NDA may be an area in which no image is provided.

The display area DA may have a polygonal shape including a rectangle, as shown in FIG. 1. For example, the display area DA may have a rectangular shape in which a horizontal length is greater than a vertical length, or may have a rectangular shape in which the horizontal length is less than the vertical length, or may have a square shape. In another example, the display area DA may have various shapes such as an elliptical shape, a circular shape, and the like.

In an embodiment, the display device 1 may include a display panel 10, a color conversion panel 20, and a filling layer 30. The display panel 10, the filling layer 30, and the color conversion panel 20 may be stacked in a thickness direction (e.g., a z direction). That is, the color conversion panel 20 may be arranged on the display panel 10, and the filling layer 30 may be arranged between the display panel 10 and the color conversion panel 20.

The display device 1 having the above-described structure may be included in a mobile phone, a television, a billboard, a monitor, a tablet personal computer (PC), a laptop computer or the like.

Figure 2:
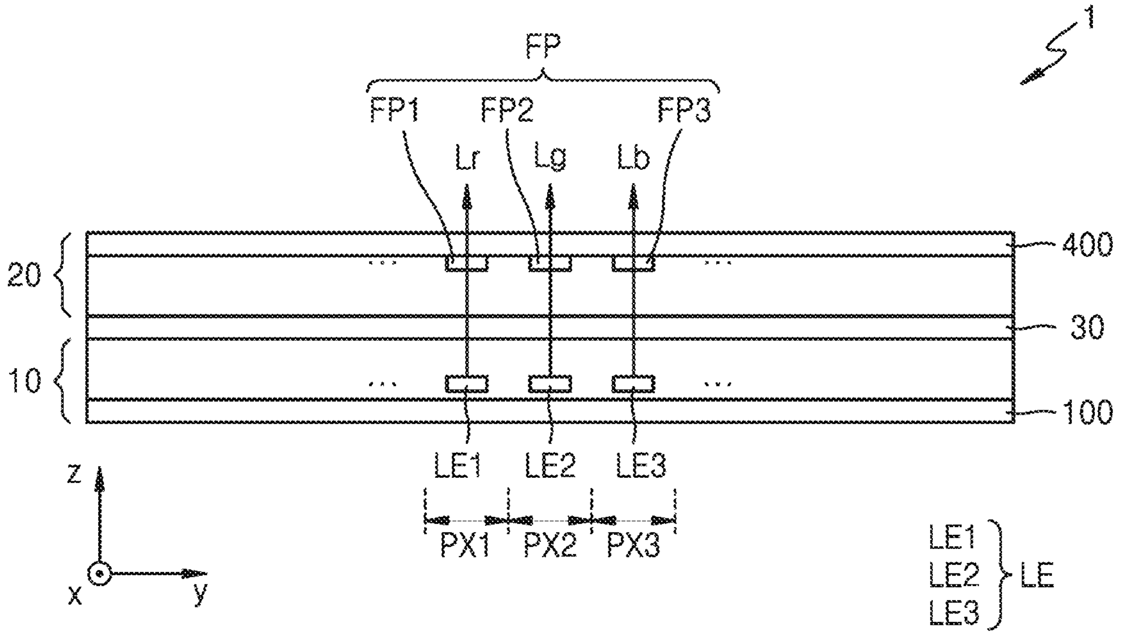
FIG. 2 is a cross-sectional view schematically illustrating a display device according to an embodiment.

FIG. 2 is a cross-sectional view schematically illustrating the display device 1 according to an embodiment.

Referring to FIG. 2, the display device 1 may include a first sub-pixel PX1, a second sub-pixel PX2, and a third sub-pixel PX3. The first sub-pixel PX1, the second sub-pixel PX2, and the third sub-pixel PX3 may be sub-pixels each emitting light of different colors. For example, the first sub-pixel PX1 may emit red light Lr, the second sub-pixel PX2 may emit green light Lg, and the third sub-pixel PX3 may emit blue light Lb.

At least one of the first sub-pixel PX1, the second sub-pixel PX2, and the third sub-pixel PX3 may be provided in a plural form. Hereinafter, for convenience of explanation, the following description assumes an example where a plurality of the first sub-pixels PX1, a plurality of the second sub-pixels PX2 and a plurality of the third sub-pixels PX3 are provided, and an embodiment of the present disclosure will be described in detail.

The display device 1 may include a display panel 10, a color conversion panel 20, and a filling layer 30. The display panel 10 may include a lower substrate 100 and a light-emitting element LE. The light-emitting element LE may be an organic light-emitting diode, for example. In an embodiment, each of the first sub-pixel PX1, the second sub-pixel PX2, and the third sub-pixel PX3 may include the light-emitting element LE. For example, the first sub-pixel PX1 may include a first light-emitting element LE1. The first light-emitting element LE1 may be a first organic light-emitting diode. The second sub-pixel PX2 may include a second light-emitting element LE2. The second light-emitting element LE2 may be a second organic light-emitting diode. The third sub-pixel PX3 may include a third light-emitting element LE3. The third light-emitting element LE3 may be a third organic light-emitting diode. That is, the display panel 10 may include a first light-emitting element LE1, a second light-emitting element LE2, and a third light-emitting element LE3.

The first light-emitting element LE1, the second light-emitting element LE2, and the third light-emitting element LE3 may emit light of the same color. In an embodiment, the first light-emitting element LE1, the second light-emitting element LE2, and the third light-emitting element LE3 may emit blue light.

The color conversion panel 20 may include an upper substrate 400 and a filter portion FP. In an embodiment, the filter portion FP may include a first filter portion FP1, a second filter portion FP2, and a third filter portion FP3. Light emitted from the first light-emitting element LE1 may pass through the first filter portion FP1 and may be emitted as red light Lr. Light emitted from the second light-emitting element LE2 may pass through the second filter portion FP2 and may be emitted as green light Lg. Light emitted from the third light-emitting element LE3 may pass through the third filter portion FP3 and may be emitted as blue light Lb.

The filter portion FP may include a functional layer and a color filter layer. In an embodiment, the functional layer may include a first quantum dot layer, a second quantum dot layer, and a transmission layer. In an embodiment, the color filter layer may include a first color filter, a second color filter, and a third color filter. The first color filter portion FP1 may include a first quantum dot layer and a first color filter. The second filter portion FP2 may include a second quantum dot layer and a second color filter. The third color filter portion FP3 may include a transmission layer and a third color filter.

The filter portion FP may be directly positioned on the upper substrate 400. In this case, "directly positioned on the upper substrate" may mean manufacturing the color conversion panel 20 by directly forming the first filter portion FP1, the second filter portion FP2, and the third filter portion FP3 on the upper substrate 400. Thereafter, the color conversion panel 20 may be bonded to the display panel 10 so that the first filter portion FP1, the second filter portion FP2, and the third filter portion FP3 may face the first light-emitting element LE1, the second light-emitting element LE2, and the third light-emitting element LE3, respectively.

The filling layer 30 may be disposed between the display panel 10 and the color conversion panel 20. The filling layer 30 may be configured to combine the display panel 10 and the color conversion panel 20 with each other. In an embodiment, the filling layer 30 may include a thermosetting or photocurable filler. Although not shown, at least one of the display panel 10 and the color conversion panel 20 may include a column spacer. For example, the display panel 10 may include a column spacer protruding toward the color conversion panel 20. In another example, the color conversion panel 20 may include a column spacer protruding toward the display panel 10. Accordingly, each of the plurality of light-emitting elements LE and the plurality of filter portions FP may maintain a certain distance, and the display device 1 may maintain uniform luminance across different positions.

Figure 3:
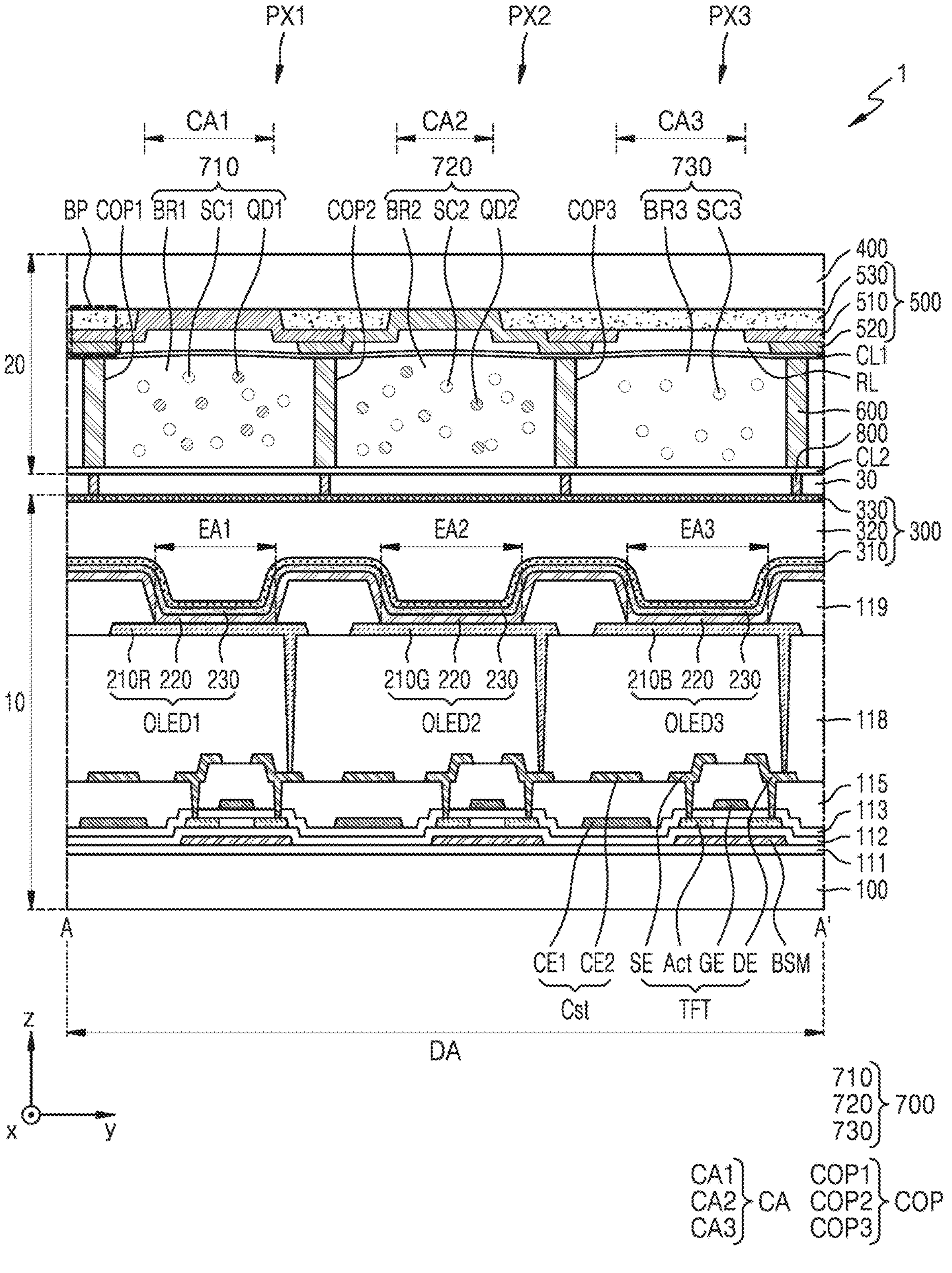
FIG. 3 is a cross-sectional view schematically illustrating the display device according to an embodiment.

FIG. 3 is a cross-sectional view schematically illustrating the display device 1 according to an embodiment. Specifically, FIG. 3 is a cross-sectional view of the display device 1 taken along a line A-A' of the display device 1 of FIG. 1.

Referring to FIG. 3, the display device 1 may include a first sub-pixel PX1, a second sub-pixel PX2, and a third sub-pixel PX3, which are arranged in the display area DA. The first sub-pixel PX1, the second sub-pixel PX2, and the third sub-pixel PX3 may emit different lights. For example, the first sub-pixel PX1 may emit red light, the second sub-pixel PX2 may emit green light, and the third sub-pixel PX3 may emit blue light.

In an embodiment, the display device 1 may include more sub-pixels. In FIG. 3, the first sub-pixel PX1, the second sub-pixel PX2, and the third sub-pixel PX3 are adjacent to each other. However, in an embodiment, the first sub-pixel PX1, the second sub-pixel PX2, and the third sub-pixel PX3 may not be disposed adjacent to each other.

The display device 1 may include the display panel 10, the color conversion panel 20, and the filling layer 30. The display panel 10 may include a lower substrate 100, and a light-emitting element disposed on the lower substrate 100 and including an intermediate layer 220. The light-emitting element may be an organic light-emitting diode. In an embodiment, the display panel 10 may include a first organic light-emitting diode OLED1, a second organic light-emitting diode OLED2, and a third organic light-emitting diode OLED3, which are arranged on the lower substrate 100. The first organic light-emitting diode OLED1, the second organic light-emitting diode OLED2, and the third organic light-emitting diode OLED3 may include the intermediate layer 220.

Hereinafter, the stack structure of the display panel 10 will be described in detail. In an embodiment, the display panel 10 may include a lower substrate 100, a first buffer layer 111, a bias electrode BSM, a second buffer layer 112, a thin-film transistor TFT, a storage capacitor Cst, a gate insulating layer 113, an intermediate insulating layer 115, a planarization layer 118, a light-emitting element, and an encapsulation layer 300. The thin-film transistor TFT may include a semiconductor layer Act, a gate electrode GE, a source electrode SE, and a drain electrode DE. The storage capacitor Cst may include a first electrode CE1 and a second electrode CE2.

The lower substrate 100 may include a glass material, a ceramic material, a metal material, or a material having flexible or bendable characteristics. When the lower substrate 100 has flexible or bendable characteristics, the lower substrate 100 may include a polymer resin such as polyether sulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The lower substrate 100 may have a single layer or multi-layered structure of the above-described materials. When the lower substrate 100 has the multi-layered structure, the lower substrate 100 may further include an inorganic layer. In an embodiment, the lower substrate 100 may have a structure of an organic material/inorganic material/organic material.

A barrier layer (not shown) may be further provided between the lower substrate 100 and the first buffer layer 111. The barrier layer may be configured to prevent impurities from the lower substrate 100 from penetrating into a semiconductor layer Act, or to minimize the penetration. The buffer layer may include an inorganic material such as oxide or nitride, an organic material, or an organic/inorganic composite material, and may have a single layer or multi-layered structure of the inorganic material and the organic material.

A bias electrode BSM may be disposed on the first buffer layer 111 to correspond to the thin-film transistor TFT. More particularly the bias electrode BSM may be disposed under the semiconductor layer Act of the thin-film transistor TFT to prevent external light from reaching the semiconductor layer Act. Thus, characteristics of the thin-film transistor TFT may be stabilized. In an embodiment, a voltage may be applied to the bias electrode BSM. The bias electrode BSM may be omitted as the occasion demand.

The semiconductor layer Act may be arranged on the second buffer layer 112. The semiconductor layer Act may include amorphous silicon or polysilicon. In an embodiment, the semiconductor layer Act may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cerium (Ce), and zinc (Zn). In an embodiment, the semiconductor layer Act may include a Zn oxide, an In—Zn oxide, a Ga—In—Zn oxide as a Zn oxide-based material. In an embodiment, the semiconductor layer Act may include an In—Ga—Zn—O (IGZO) semiconductor, an In—Sn—Zn—O (ITZO) semiconductor, an In—Ga—Sn—Zn—O (IGTZO) semiconductor in which In, Ga, Sn is included in ZnO. The semiconductor layer Act may include a channel region, and a source region and a drain region may be disposed on both sides of the semiconductor layer Act with the channel region therebetween. The semiconductor layer Act may have a single layer or multi-layered structure.

A gate electrode GE may be disposed on the semiconductor layer Act with the gate insulating layer 113 therebetween. At least a part of the gate electrode GE may overlap the semiconductor layer Act. The gate electrode GE may have a single layer or multi-layered structure including molybdenum (Mo), Al, copper (Cu), Ti, and the like. In an example, the gate electrode GE may have a single layer structure of Mo. A first electrode GE1 of the storage capacitor Cst may be disposed on the same layer as the gate electrode GE. The first electrode CE1 and the gate electrode GE may include the same material.

In FIG. 3, the gate electrode GE of the thin-film transistor TFT and the first electrode CE1 of the storage capacitor Cst are separately arranged. However, the storage capacitor Cst may overlap the thin-film transistor TFT. In this case, the gate electrode GE of the thin-film transistor TFT may function as the first electrode CE1 of the storage capacitor Cst.

The interlayer insulating layer 115 may be provided to cover the gate electrode GE and the first electrode CE1 of the storage capacitor Cst. The interlayer insulating layer 115 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be zinc oxide (ZnO) or peroxide ($ZnO_2$).

The second electrode CE2 of the storage capacitor Cst, the source electrode SE, and the drain electrode DE may be arranged on the interlayer insulating layer 115. The second electrode CE2 of the storage capacitor Cst, the source electrode SE, and the drain electrode DE may include a conductive material including Mo, Al, Cu, and Ti, and may have a single layer or multi-layered structure including the above-described materials. For example, the second electrode CE2 of the storage capacitor Cst, the source electrode SE, and the drain electrode DE may have a three-layer structure of Ti/Al/Ti. The source electrode SE and the drain electrode DE may be connected to the source region or the drain region of the semiconductor layer Act through a contact hole.

The second electrode CE2 of the storage capacitor Cst may overlap the first electrode CE1 with the interlayer insulating layer 115 therebetween and may constitute the storage capacitor Cst. In this case, the interlayer insulating layer 115 may serve as a dielectric layer of the storage capacitor Cst.

A planarization layer 118 may be disposed on the second electrode CE2 of the storage capacitor Cst, the source electrode SE and the drain electrode DE. The planarization layer 118 may have a single layer or multi-layered structure including an organic material, and may provide a flat top surface. The planarization layer 118 may include a general common use polymer such as benzocyclobutene (BCB), polyimide, hexamethyldisiloxane (HMDSO), polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, or vinyl alcohol-based polymer, a blend thereof, and the like.

The light-emitting element may be disposed on the planarization layer 118. The light-emitting element may include a pixel electrode, an intermediate layer 220, and an opposite electrode 230. In an embodiment, the first organic light-emitting diode OLED1, the second organic light-emitting diode OLED2, and the third organic light-emitting diode OLED3 may be arranged on the planarization layer 118. The first organic light-emitting diode OLED1, the second organic light-emitting diode OLED2, and the third organic light-emitting diode OLED3 may include a first sub-pixel electrode 210R, a second sub-pixel electrode 210G, and a third sub-pixel electrode 210B. In an embodiment, the first organic light-emitting diode OLED1, the second organic light-emitting diode OLED2, and the third organic light-emitting diode OLED3 may include the intermediate layer 220 and the opposite electrode 230 commonly. The present disclosure, however, is not limited thereto. The intermediate layer 220 is formed separately to correspond to the first organic light-emitting diode OLED1, the second organic light-emitting diode OLED2, and the third organic light-emitting diode OLED3.

The first sub-pixel electrode 210R, the second sub-pixel electrode 210G, and the third sub-pixel electrode 210B may be arranged on the planarization layer 118. Each of the first sub-pixel electrode 210R, the second sub-pixel electrode 210G, and the third sub-pixel electrode 210B may be connected to the thin-film transistor TFT. The first sub-pixel electrode 210R, the second sub-pixel electrode 210G, and the third sub-pixel electrode 210B may be (semi-) transparent electrodes or reflective electrodes. In an embodiment, the first sub-pixel electrode 210R, the second sub-pixel electrode 210G, and the third sub-pixel electrode 210B may include a reflective layer formed of silver (Ag), Mg, Al, platinum (Pt), palladium (Pd), gold (Au), nickel (Ni), neodymium (Nd), iridium (Ir), chromium (Cr), and a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the first sub-pixel electrode 210R, the second sub-pixel electrode 210G, and the third sub-pixel electrode 210B may have a triple layered structure of ITO/Ag/ITO.

A pixel-defining layer 119 may be disposed above the planarization layer 118. The pixel-defining layer 119 may include openings each of which extend to the center of the first sub-pixel electrode 210R, the second sub-pixel electrode 210G, and the third sub-pixel electrode 210B, respectively. The pixel-defining layer 119 may cover edges of the first sub-pixel electrode 210R, the second sub-pixel electrode 210G, and the third sub-pixel electrode 210B. The pixel-defining layer 119 may increase a distance between edges of the pixel electrodes, e.g., edges of the first sub-pixel electrode 210R, the second sub-pixel electrode 210G, and the third sub-pixel electrode 210B, and the opposite electrode 230, which is disposed above the first sub-pixel electrode 210R, the second sub-pixel electrode 210G, and the third sub-pixel electrode 210B, thereby preventing an arc etc. from occurring in the edges of the first sub-pixel electrode 210R, the second sub-pixel electrode 210G, and the third sub-pixel electrode 210B. The pixel-defining layer 219 may include one or more organic insulating materials selected from the group consisting of polyimide, polyamide, an acryl resin, BCB, HMDSO, and a phenol resin, by using a method such as spin coating or the like.

The intermediate layer 220 of the first organic light-emitting diode OLED1, the second organic light-emitting diode OLED2, and the third organic light-emitting diode OLED3 may include a light-emitting layer formed of an organic material including a fluorescent or phosphorous material that emits red, green, blue or white light. The intermediate layer 220 may further include, in addition to various organic materials, a metal-containing compound such as an organometallic compound, an inorganic material such as a quantum dot, and the like. The intermediate layer 220 may be formed of a low molecular weight organic material or polymer organic material, and a functional layer such as a hole transport layer (HTL), a hole injection layer (HIL), an electron transport layer (ETL), and an electron injection layer (EIL), may be further selectively arranged under, or on the intermediate layer 220. In FIG. 3, the intermediate layer 220 is shown as being integrally provided over the first sub-pixel electrode 210R, the second sub-pixel electrode 210G, and the third sub-pixel electrode 210B. However, embodiments of the present disclosure are not limited thereto, and various modifications, such as the intermediate layer 220 being arranged to correspond to each of the first sub-pixel electrode 210R, the second sub-pixel electrode 210G, and the third sub-pixel electrode 210B, are possible.

The intermediate layer 220 may be provided in a common layer disposed over the first sub-pixel electrode 210R, the second sub-pixel electrode 210G, and the third sub-pixel electrode 210B, as described above. However, if necessary, the intermediate layer 220 may be provided to have a patterned layer to correspond to each of the first sub-pixel electrode 210R, the second sub-pixel electrode 210G, and the third sub-pixel electrode 210B. In any case, the intermediate layer 220 may include a first color light-emitting layer which emits light in a first wavelength band, for example, light having a wavelength of 450 nm to 495 nm. The first-color light-emitting layer may be commonly disposed over the first sub-pixel electrode 210R, the second sub-pixel electrode 210G, and the third sub-pixel electrode 210B, or the first-color light-emitting layer may have a patterned layer to correspond to each of the first sub-pixel electrode 210R, the second sub-pixel electrode 210G, and the third sub-pixel electrode 210B.

The opposite electrode 230 may be disposed on the intermediate layer 220 to correspond to the first sub-pixel electrode 210R, the second sub-pixel electrode 210G, and the third sub-pixel electrode 210B. The opposite electrode 230 may be commonly provided in a plurality of organic light-emitting diodes. In an embodiment, the opposite electrode 230 may be a transparent or semi-transparent electrode, and may include a metal thin layer having a small work function and including lithium (Li), calcium (Ca), lithium fluoride (LiF)/Al, Al, aluminum (Ag), magnesium (Mg), and a compound thereof. In addition, a transparent conductive oxide (TCO) layer such as ITO, IZO, ZnO or $In_2O_3$, may be further disposed on the metal thin layer.

In an embodiment, first light may be generated in a first emission area EA1 of the first organic light-emitting diode OLED1 and may be emitted to the outside. The first emission area EA1 may be defined by an opening of the pixel-defining layer 119 extending to the first sub-pixel electrode 210R. Second light may be generated in a second emission area EA2 of the second organic light-emitting diode OLED2 and may be emitted to the outside. The second emission area EA2 may be defined by an opening of the pixel-defining layer 119 extending to the second sub-pixel electrode 210G. Third light may be generated in a third emission area EA3 of the third organic light-emitting diode OLED3 and may be emitted to the outside. The third emission area EA3 may be defined by an opening of the pixel-defining layer 119 extending to the third sub-pixel electrode 210B.

The first emission area EA1, the second emission area EA2, and the third emission area EA3 may be spaced apart from each other. An area of the display area DA except the first emission area EA1, the second emission area EA2, and the third emission area EA3 may be a non-emission area. The first emission area EA1, the second emission area EA2, and the third emission area EA3 may be distinguished from each other by the non-emission area. In a plan view, the first emission area EA1, the second emission area EA2, and the third emission area EA3 may be arranged in various arrangements such as a stripe arrangement, a pentile arrangement, and the like. In a plan view, the shape of the first emission area EA1, the shape of the second emission area EA2, and the shape of the third emission area EA3 may be any one of a polygonal shape, a circular shape, and an elliptical shape.

A spacer (not shown) for preventing scratch of a mask may be further included on the pixel-defining layer 119. The spacer may be formed integrally with the pixel-defining layer 119. For example, the spacer and the pixel-defining layer 119 may be simultaneously formed in the same process by using a halftone mask process.

The encapsulation layer 300 may be disposed on a display element and may cover the display element. The first organic light-emitting diode OLED1, the second organic light-emitting diode OLED2, and the third organic light-emitting diode OLED3 may be easily damaged by moisture or oxygen from the outside and thus may be protected by the encapsulation layer 300 covering the first organic light-emitting diode OLED1, the second organic light-emitting diode OLED2, and the third organic light-emitting diode OLED3. The encapsulation layer 300 may cover the display area DA and may extend to an outside of the display area DA. The encapsulation layer 300 may include at least one inorganic encapsulation layer and at least one organic encapsulation layer. For example, the encapsulation layer 300 may include a first inorganic encapsulation layer 310, an organic encapsulation layer 320, and a second inorganic encapsulation layer 330.

The first inorganic encapsulation layer 310 may extend along a structure thereunder and thus, a top surface of the first inorganic encapsulation layer 310 may not be flat. The organic encapsulation layer 320 may cover the first inorganic encapsulation layer 310, and a top surface of the organic encapsulation layer 320 may be approximately flat, unlike the first inorganic encapsulation layer 310.

The first inorganic encapsulation layer 310 and the second inorganic encapsulation layer 330 may include one or more inorganic materials from among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon oxide ($SiN_x$), and silicon oxynitride (SiON). The organic encapsulation layer 320 may include a polymer-based material. The polymer-based material may include an acryl-based resin, an epoxy-based resin, polyimide, polyethylene, or the like. In an embodiment, the organic encapsulation layer 320 may include acrylate.

Even if crack occurs in the encapsulation layer 300 through the above-described multi-layered structure, the crack can be prevented from connecting between the first inorganic encapsulation layer 310 and the second organic encapsulation layer 320, or between the organic encapsulation layer 320 and the second inorganic encapsulation layer 330. Thus, a path, through which moisture or oxygen etc. from the outside penetrates into the display area DA, may be prevented from being formed, or formation of the path may be minimized. Although not shown, other layers such as a capping layer and the like may be interposed between the first inorganic encapsulation layer 310 and the opposite electrode 230 if necessary.

The color conversion panel 20 may include an upper substrate 400, a color filter layer 500, a refractive layer RL, a first capping layer CL1, a bank 600, a functional layer 700, and a second caping layer CL2. The upper substrate 400 may be disposed on the lower substrate 100 so that the light-emitting element may be interposed between the upper substrate 400 and the lower substrate 100. The upper substrate 400 may be arranged on the first organic light-emitting diode OLED1, the second organic light-emitting diode OLED2, and the third organic light-emitting diode OLED3.

The upper substrate 400 may include a light-transmitting area CA overlapping the light-emitting element. In an embodiment, the light-transmitting area CA may include a first light-transmitting area CA1, a second light-transmitting area CA2, and a third light-transmitting area CA3. The first light-transmitting area CA1 may overlap the first light-emitting element (see LE1 of FIG. 2). In a plan view, the first light-transmitting area CA1 may overlap the first organic light-emitting diode OLED1 or the first emission area EA1. The second light-transmitting area CA2 may overlap the second light-emitting element (see LE2 of FIG. 2). In a plan view, the second light-transmitting area CA2 may overlap the second organic light-emitting diode OLED2 or the first emission area EA2. The third light-transmitting area CA3 may overlap the third light-emitting element (see LE3 of FIG. 2). In a plan view, the third light-transmitting area CA3 may overlap the third organic light-emitting diode OLED3 or the third emission area EA3.

The light-transmitting area CA may be defined as a color filter. For example, the light-transmitting area CA may mean an area where only one color filter is disposed. In an embodiment, the first light-transmitting area CA1 may an area where only the first color filter 510 is disposed. Also, the second light-transmitting area CA2 may be an area where only the second color filter 520 is disposed. The third light-transmitting area CA3 may be an area where only the third color filter 530 is disposed. In this case, the first light-transmitting area CA1 and the second light-transmitting area CA2 may be defined by the third color filter 530. That is, the first light-transmitting area CA1 and the second light-transmitting area CA2 may be defined as a patterned area, that is an open portion, of the third color filter 530.

The upper substrate 400 may include glass, metal or polymer resin. When the upper substrate 400 has flexible or bendable characteristics, the lower substrate 100 may include a polymer resin such as polyether sulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). In an embodiment, the upper substrate 400 may have a multi-layered structure including two layers including polymer resin and a barrier layer including an inorganic material such as silicon oxide ($SiO_2$), silicon nitride ($SiN_x$), silicon oxynitride (SiON), or the like interposed between the two layers.

The color filter layer 500 may be disposed under the upper substrate 400. The color filter layer 500 may be disposed on a bottom surface of the upper substrate 400 in a direction from the upper substrate 400 to the lower substrate 100. The color filter layer 500 may include a first color filter 510, a second color filter 520, and a third color filter 530.

The first color filter 510 may be disposed in the first light-transmitting area CA1. The first color filter 510 may overlap the first light-transmitting area CA1. The second color filter 510 may be disposed in the second light-transmitting area CA2. The second color filter 520 may overlap the second light-transmitting area CA2. The third color filter 530 may be disposed in the third light-transmitting area CA3. The third color filter 530 may overlap the third light-transmitting area CA3.

The first color filter 510, the second color filter 520, and the third color filter 530 may be formed of a photosensitive resin. The first color filter 510, the second color filter 520, and the third color filter 530 may include dyes that represent a unique color. The first color filter 510 may allow only light having a wavelength belonging to 630 nm to 780 nm to pass therethrough, the second color filter 520 may allow only light having a wavelength belonging to 495 nm to 570 nm to pass therethrough, and the third color filter 530 may allow only light having a wavelength belonging to 450 nm to 495 nm to pass therethrough.

The color filter layer 500 may be configured to reduce reflection of external light of the display device 1. For example, when external light reaches the first color filter 510, only light having a preset wavelength, i.e., 630 nm to 780 nm, as described above may pass through the first color filter 510, and light having other wavelengths may be absorbed to the first color filter 510. Thus, only the light having the preset wavelength among the external light incident on the display device 1 may pass through the first color filter 510, and a part of the light having the preset wavelength may be reflected on the opposite electrode 230 or the first sub-pixel electrode 210R thereunder and emitted to the outside again. Since only some of the external light incident on a place where the first sub-pixel PX1 is located is reflected to the outside, it may serve to reduce reflection of the external light. This description may be applied to the second color filter 520 and the third color filter 530.

The first color filter 510, the second color filter 520, and the third color filter 530 may overlap each other. The first color filter 510, the second color filter 520, and the third color filter 530 may overlap between one of the light-transmitting area CA and the other one of the light-transmitting area CA. For example, the first color filter 510, the second color filter 520, and the third color filter 530 may overlap between the first light-transmitting area CA1 and the second light-transmitting area CA2. In this case, the third color filter 530 may be arranged on a bottom surface of the upper substrate 400 between the first light-transmitting area CA1 and the second light-transmitting area CA2. The first color filter 510 may extend from the first light-transmitting area CA1 and may overlap the third color filter 530. The second color filter 520 may extend from the second light-transmitting area CA2 and may overlap the third color filter 530.

The first color filter 510, the second color filter 520, and the third color filter 530 may overlap between the second light-transmitting area CA2 and the third light-transmitting area CA3. The first color filter 510 may be arranged on the bottom surface of the upper substrate 400 between the second light-transmitting area CA2 and the third light-transmitting area CA3. The second color filter 520 may extend from the second light-transmitting area CA2 and may overlap the first color filter 510. The third color filter 530 may extend from the third light-transmitting area CA3 and may overlap the first color filter 510.

The first color filter 510, the second color filter 520, and the third color filter 530 may overlap between the third light-transmitting area CA3 and the first light-transmitting area CA1. The third color filter 530 may be arranged on the bottom surface of the upper substrate 400 between the third light-transmitting area CA3 and the first light-transmitting area CA1. The first color filter 510 may extend from the first light-transmitting area CA1 and may overlap the third color filter 520. A portion of the second color filter 520, which is spaced apart from the second color filter 520 disposed in the second light-transmitting area CA2, is disposed on the first color filter 510.

The first color filter 510, the second color filter 520, and the third color filter 530 may overlap each other and may constitute a light blocking portion BP. Thus, the color filter layer 500 may prevent or reduce color mixture without an additional light blocking member.

In an embodiment, the third color filter 530 may be first stacked on the upper substrate 400. This is because the third color filter 530 may absorb partially the external light incident from the outside of the upper substrate 400 to reduce the reflectance of the display device 1 and the light reflected by the third color filter 530 is not visible to a user.

The refractive layer RL may be disposed in the light-transmitting area CA. The reflective layer RL may be arranged in the first light-transmitting area CA1, the second light-transmitting area CA2, and the third light-transmitting area CA3, respectively. The refractive layer RL may include an organic material. In an embodiment, the refractive index of the refractive layer RL may be less than the refractive index of the first capping layer CL1. In an embodiment, the refractive index of the refractive layer RL may be less than the refractive index of the color filter layer 500. Thus, the refractive index RL may concentrate light.

The first capping layer CL1 may be arranged on the refractive index RL and the color filter layer 500. In an embodiment, the first capping layer CL1 may be arranged between the color filter layer 500 and the functional layer 700. The first capping layer CL1 may protect the refractive layer RL and the color filter layer 500. The first capping layer CL1 may prevent or reduce impurities such as moisture or air from the outside from damaging or contaminating the refractive layer RL or the color filter layer 500. The first capping layer CL1 may include an inorganic material.

The bank 600 may be arranged on the first capping layer CL1. In an embodiment, the bank 600 may be disposed on the upper substrate 400. The bank 600 may be arranged on the bottom surface of the upper substrate 400 facing the lower substrate 100. The bank 600 may be arranged below the color filter layer 500. The bank 600 may include an organic material. In an embodiment, the bank 600 may include a light blocking material to serve as a light blocking layer. The light blocking material may include, for example, at least one of black pigments, black dyes, black particles or metal particles.

The bank 600 may include a plurality of openings. For example, the bank 600 may include a bank opening COP. The bank opening COP may overlap the light-transmitting area CA. In an embodiment, the plurality of bank openings COP may overlap the light-transmitting area CA. For example, the first bank opening COP1 may overlap the first light-transmitting area CA1. The second bank opening COP2 may overlap the second light-transmitting area CA2. The third bank opening COP3 may overlap the third light-transmitting area CA3.

The functional layer 700 may be arranged in the bank opening COP. The functional layer 700 may fill the bank opening COP. In an embodiment, the functional layer 700 may include at least one of a color conversion material and a scattering body. In an embodiment, the color conversion material may be a quantum dot. In an embodiment, the functional layer 700 may include a first quantum dot layer 710, a second quantum dot layer 720, and a transmission layer 730.

The first quantum dot layer 710 may be arranged in the first bank opening COP1. The first quantum dot layer 710 may overlap the first light-transmitting area CA1. The first quantum dot layer 710 may fill the first bank opening COP1. The first quantum dot layer 710 may overlap the first emission area EA1. The first sub-pixel PX1 may include the first organic light-emitting diode OLED1 and the first quantum dot layer 710.

The first quantum dot layer 710 may convert light having a first wavelength band generated in the intermediate layer 220 on the first sub-pixel electrode 210R into light having a second wavelength band. For example, when light having a wavelength belonging to about 450 nm to about 495 nm is generated in the intermediate layer 220 on the first sub-pixel electrode 210R, the first quantum dot layer 710 may convert this light into light having a wavelength belonging to about 630 nm to about 780 nm. Thus, in the first sub-pixel PX1, light having a wavelength belonging to about 630 nm to about 780 nm may be emitted to the outside through the upper substrate 400. In an embodiment, the first quantum dot layer 710 may include a first quantum dot QD1, a first scattering body SC1, and a first base resin BR1. The first quantum dot QD1 and the first scattering body SC1 may be dispersed into the first base resin BR1.

The second quantum dot layer 720 may be arranged in the second bank opening COP2. The second quantum dot layer 720 may overlap the second light-transmitting area CA2. The second quantum dot layer 720 may fill the second bank opening COP2. The second quantum dot layer 720 may overlap the second emission area EA2. The second sub-pixel PX2 may include the second organic light-emitting diode OLED2 and the second quantum dot layer 720.

The second quantum dot layer 720 may convert light having a first wavelength band generated in the intermediate layer 220 on the second sub-pixel electrode 210G into light having a third wavelength band. For example, when light having a wavelength belonging to about 450 nm to about 495 nm is generated in the intermediate layer 220 on the second sub-pixel electrode 210G, the second quantum dot layer 720 may convert this light into light having a wavelength belonging to about 495 nm to about 570 nm. Thus, in the second sub-pixel PX2, light having a wavelength belonging to about 495 nm to about 570 nm may be emitted to the outside through the upper substrate 400. In an embodiment, the second quantum dot layer 720 may include a second quantum dot QD2, a second scattering body SC2, and a second base resin BR2. The second quantum dot QD2 and the second scattering body SC2 may be dispersed into the second base resin BR2.

The transmission layer 730 may be arranged in the third bank opening COP3. The transmission layer 730 may overlap the third light-transmitting area CA3. The transmission layer 730 may fill the third bank opening COP3. The transmission layer 730 may overlap the third emission area EA3. The third sub-pixel PX3 may include the third organic light-emitting diode OLED3 and the transmission layer 730.

The transmission layer 730 may emit light generated in the intermediate layer 220 on the third sub-pixel electrode 210B to the outside without wavelength conversion. For example, when light having a wavelength belonging to about 450 nm to about 495 nm is generated in the intermediate layer 220 on the third sub-pixel electrode 210B, the transmission layer 730 may emit the light to the outside without wavelength conversion. In an embodiment, the transmission layer 730 may include a third scattering body SC3 and a third base resin BR3. The third scattering body SC3 may be dispersed into the third base resin BR3. In an embodiment, the transmission layer 730 may not include quantum dots.

At least one of the first quantum dot QD1 and the second quantum dot QD2 may include cadmium sulfide (CdS), cadmium telluride (CdTe), zinc sulfide (ZnS), indium phosphide (InP), or the like. Quantum dots may have a size of several nanometers, and the wavelength of light after conversion may vary depending on the size of the quantum dots.

In an embodiment, the core of the quantum dots may be selected from an II-VI-group compound, an III-V-group compound, an IV-VI-group compound, an IV-group element, an IV-group compound, and a combination thereof.

The II-VI-group compound may be selected from the group consisting of a binary compound selected from the group consisting of CdSe, CdTe, ZnS, ZnSe, ZnTe, ZnO, HgS, HgSe, HgTe, MgSe, MgS and a mixture thereof, a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof, and a quarternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The III-V-group compound may be selected from the group consisting of a binary compound selected from the group consisting of GaN, GaP, GaAs, GaSb, AlN, AlP, AlAs, AlSb, InN, InP, InAs, InSb and a mixture thereof, a ternary compound selected from the group consisting of GaNP, GaNAs, GaNSb, GaPAs, GaPSb, AlNP, AlNAs, AlNSb, AlPAS, AlPSb, InGaP, InNP, InNAs, InNSb, InPAs, InPSb and a mixture thereof, and a quarternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

The IV-VI-group compound may be selected from the group consisting of a binary compound selected from the group consisting of SnS, SnSe, SnTe, PbS, PbSe, PbTe and a mixture thereof, a ternary compound selected from the group consisting of SnSeS, SnSeTe, SnSTe, PbSeS, PbSeTe, PbSTe, SnPbS, SnPbSe, SnPbTe and a mixture thereof, and a quarternary compound selected from the group consisting of SnPbSSe, SnPbSeTe, SnPbSTe and a mixture compound thereof. The IV-group element may be selected from the group consisting of Si, Ge and a mixture thereof. The IV-group element may be a binary compound selected from the group consisting of Si, Ge and a mixture thereof.

In this case, the binary compound, the ternary compound or the quarternary compound may exist in particles with uniform concentration or may be divided into states where concentration distribution is partially different and may exist in the same particles. In addition, one quantum dot may have a core-shell structure surrounding another quantum dot. An interface between the core and the shell may have a concentration gradient in which the concentration of the element present in the shell decreases toward the center.

In an embodiment, quantum dots may have a core-shell structure including the aforementioned nanocrystals and a shell surrounding the core. The shell of the quantum dot may serve as a protective layer for maintaining semiconductor characteristics by preventing chemical deformation of the core or a charging layer for imparting electrophoretic characteristics to the quantum dot. The shell may be a single layer or multiple layers. An interface between the core and the shell may have a concentration gradient in which the concentration of the element present in the shell decreases toward the center. Examples of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a ternary compound such as $MgAl_2O_4$, $CoFe_2O_4$, $NiFe_2O_4$, $CoMn_2O_4$. However, embodiments are not limited thereto.

The semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, embodiments are not limited thereto.

Quantum dots may have a full width of half maximum (FWHM) of the emission wavelength spectrum of about 45 nm or less, particularly about 40 nm or less, and more particularly about 30 nm or less, and in this range, color purity or color reproducibility may be improved. Thus, light emitted through the quantum dots may be emitted in all directions and thus a light viewing angle may be improved.

In addition, the shape of quantum dots is not particularly limited to those commonly used in the field, but more specifically, spherical, pyramid, multi-arm, or cubic nanoparticles, nanotubes, nanowires, nanofibers, and nano-plate particles can be used.

The quantum dot may adjust the color of the emitted light according to the particle size, and accordingly, the quantum dot may have various light emitting colors such as blue, red, and green.

The first scattering body SC1, the second scattering body SC2, and the third scattering body SC3 may scatter light so that more light may be emitted. The first scattering body SC1, the second scattering body SC2, and the third scattering body SC3 may increase light emission efficiency. At least one of the first scattering body SC1, the second scattering body SC2, and the third scattering body SC3 may be formed of any material among metal or metal oxide to scatter light uniformly. For example, at least one of the first scattering body SC1, the second scattering body SC2, and the third scattering body SC3 may be at least one of $TiO_2$, $ZrO_2$, $Al_2O_3$, $In_2O_3$, ZnO, $SnO_2$, $Sb_2O_3$, and ITO. In addition, at least one of the first scattering body SC1, the second scattering body SC2, and the third scattering body SC3 may have a refractive index of 1.5 or more. Thus, the light emission efficiency of the functional layer 700 may be improved. In an embodiment, at least one of the first scattering body SC1, the second scattering body SC2, and the third scattering body SC3 may be omitted.

The first base resin BR1, the second base resin BR2, and the third base resin BR3 may be light-transmitting materials. For example, at least one of the first base resin BR1, the second base resin BR2, and the third base resin BR3 may include polymer resin such as acryl, BCB or HMDSO.

The second capping layer CL2 may be arranged on the bank layer 600 and the functional layer 700. The second capping layer CL2 may protect the bank layer 600 and the functional layer 700. The second capping layer CL2 may prevent or reduce impurities such as moisture or air from the outside from damaging or contaminating the bank layer 600 or the functional layer 700. The second capping layer CL2 may include an inorganic material.

In the display device 1 as described above, light having the second wavelength band may be emitted to the outside from the first sub-pixel PX1, light having the third wavelength band may be emitted to the outside from the second sub-pixel PX2, and light having the first wavelength band may be emitted to the outside from the third sub-pixel PX3. That is, the display device 1 may display a full-color image.

The filling layer 30 may be disposed between the display panel 10 and the color conversion panel 20. In an embodiment, the filling layer 30 may be arranged between the encapsulation layer 300 and the bank layer 600. The filling layer 30 may as a buffer against external pressure or the like. The filling layer 30 may include a filling material. In an embodiment, the filling layer 30 may include a thermosetting or photocurable filler. The filling material may include an organic material such as methyl silicon, phenyl silicon, polyimide, or the like. However, embodiments of the present disclosure are not limited thereto, and the filling material may include urethane-based resin, epoxy-based resin and acryl-based resin which are organic sealants, an inorganic sealant, or silicon.

At least one of the display panel 10 and the color conversion panel 20 may include a column spacer 800. In an embodiment, the color conversion panel 20 may include the column spacer 800. In an embodiment, the display panel 10 may include the column spacer 800. Hereinafter, the case where the color conversion panel 20 includes the column spacer 800 will be described in detail. The column spacer 800 may be disposed on the bank 600 and may face the lower substrate 100. The column spacer 800 may separate the encapsulation layer 300 from the bank 600. The column spacer 800 may penetrate the filling layer 30. The column spacer 800 may include an organic material. In an embodiment, the column spacer 800 may include an acryl-based material.

The column spacer 800 may separate the light-emitting element and the functional layer 700 from each other at uniform intervals. Thus, the filling layer 30 may be disposed in the display area DA with a uniform thickness. In other words, a distance between the first organic light-emitting diode OLED1 and the first quantum dot layer 710 may be substantially the same as a distance between the second organic light-emitting diode OLED2 and the second quantum dot layer 720. In addition, a distance between the second organic light-emitting diode OLED2 and the second quantum dot layer 720 may be substantially the same as a distance between the third organic light-emitting diode OLED3 and the transmission layer 730. When the color spacer 800 is omitted, unlike in the present embodiment, a plurality of light-emitting elements and a functional layer may not maintain a uniform distance. For example, the thickness of the filling layer 30 in the first light-transmitting area CA1 may be different from the thickness of the filling layer 30 in the second light-transmitting area CA2. Without the color spacer 800, the luminance of light emitted from the first organic light emitting diode OLED1 and passing through the filling layer 30 overlapping the first light transmitting area CA1 may be different from the luminance of light emitted from the second organic light emitting diode OLED2 and passing through the filling layer 30 overlapping the second light transmitting area CA2. In the present embodiment, the column spacer 800 penetrates into the filling layer 30 and may allow the light-emitting element and the functional layer 700 to be spaced apart from each other at uniform intervals. In addition, due to the filling layer 30, a phenomenon in which luminance varies depending on the location in the display area DA may be prevented or reduced.

Figure 4:
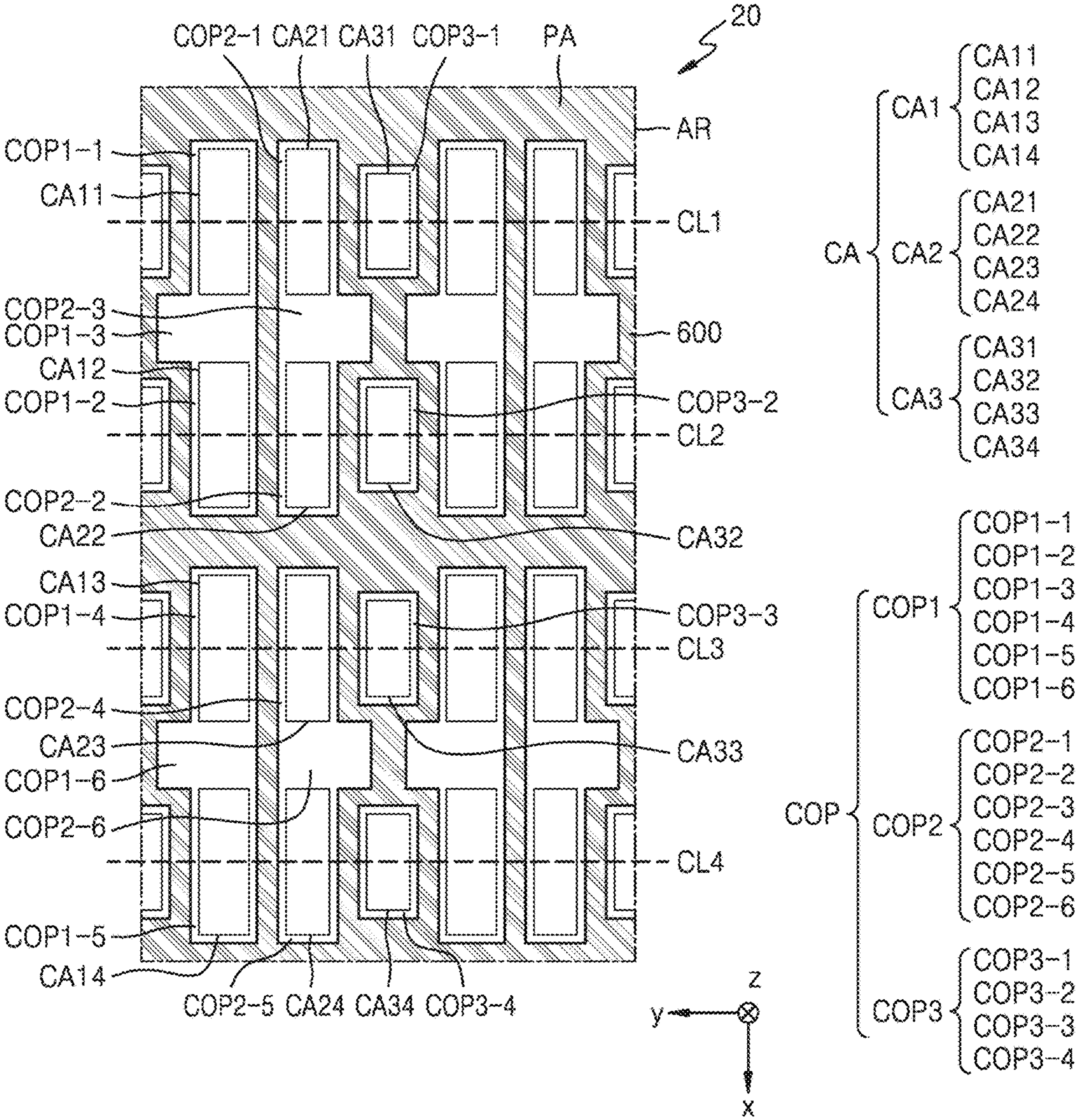
FIG. 4 is a plan view schematically illustrating a part of a color conversion panel according to an embodiment.

FIG. 4 is a plan view schematically illustrating a part of a color conversion panel according to an embodiment. Specifically, FIG. 4 may correspond to a portion AR of FIG. 1.

Referring to FIGS. 3 and 4, the upper substrate 400 may include a light-transmitting area CA and a peripheral area PA. The light-transmitting area CA may be an area in which the color filter layer 500 is disposed. Specifically, the light-transmitting area CA may be an area where only one color filter is disposed. The peripheral area PA may be a light blocking area.

In an embodiment, the light-transmitting area CA may include a first light-transmitting area CA1, a second light-transmitting area CA2, and a third light-transmitting area CA3. The first light-transmitting area CA1, the second light-transmitting area CA2, and the third light-transmitting area CA3 may be spaced apart from each other.

Each of the first light-transmitting area CA1 and the second light-transmitting area CA2 may allow one of red light and green light to transmit therethrough. For example, the first light-transmitting area CA1 may allow red light to transmit therethrough, and the second light-transmitting area CA2 may allow green light to transmit therethrough. In addition, the third light-transmitting area CA3 may allow blue light to transmit therethrough.

For example, at least one of the first light-transmitting area CA1, the second light-transmitting area CA2, and the third light-transmitting are CA3 may have a rectangular shape. However, this is exemplary, and the shape of the first light-transmitting area CA1, the second light-transmitting area CA2, and the third light-transmitting area CA3 is not limited thereto. Hereinafter, for convenience of explanation, the case where the first light-transmitting area CA1, the planar shape of the second light-transmitting area CA2, and the planar shape of the third light-transmitting area CA3 have rectangular shapes will be described in detail.

The peripheral area PA may be outside the light-transmitting area CA. The peripheral area PA may surround at least a part of the light-transmitting area CA. In an embodiment, the peripheral area PA may surround the light-transmitting area CA entirely. The peripheral area PA may surround at least a part of the first light-transmitting area CA1. The peripheral area PA may surround the second light-transmitting area CA2 entirely. The peripheral area PA may surround the third light-transmitting area CA3 entirely.

The bank 600 may include the bank opening COP. In an embodiment, the bank opening COP may overlap the light-transmitting area CA. The functional layer 700 may be filled in the bank opening COP. The bank opening COP may include a first bank opening COP1, a second bank opening COP2, and a third bank opening COP3. The first bank opening COP1 may be disposed to overlap the first light-transmitting area CA1. The second bank opening COP2 may be disposed to overlap the second light-transmitting area CA2. The third bank opening COP3 may be disposed to overlap the third light-transmitting area CA3. at least one of the first bank opening COP1, the second bank opening COP2, and the third bank opening COP3 may have square shapes. Hereinafter, for convenience of explanation, the case where the first bank opening COP1, the second bank opening COP2, and the third bank opening COP3 have square shapes will be described in detail.

In an embodiment, in a plan view, the edge (or an inner surface) of the bank opening COP may not coincide with the edge of the light-transmitting area CA but may be spaced from the edge of the light-transmitting area CA. The edge (or an inner surface) of the bank opening COP may surround the edge (or an inner surface) of the light-transmitting area CA. In a plan view, the size of the bank opening COP may be greater than the size of the light-transmitting area CA.

The functional layer 700 may be arranged in the bank opening COP. The functional layer 700 may fill the bank opening COP. In an embodiment, the functional layer 700 may include at least one of a color conversion material and a scattering body. In an embodiment, the color conversion material may include a quantum dot. In an embodiment, the functional layer 700 may include a first quantum dot layer 710, a second quantum dot layer 720, and a transmission layer 730. The first quantum dot layer 710 may be arranged in the first bank opening COP1. The second quantum dot layer 720 may be arranged in the second bank opening COP2. The transmission layer 730 may be arranged in the third bank opening COP3.

The first light-transmitting area CA1 may be provided in plurality. A plurality of first light-transmitting areas CA1 may be spaced apart from each other in a first direction (e.g., an x axis direction). For example, the first light-transmitting area CA1 may include a 1st-1 light-transmitting area CA11, a 1st-2 light-transmitting area CA12, a 1st-3 light-transmitting area CA13, and a 1st-4 light-transmitting area CA14. The 1st-2 light-transmitting area CA12 may be spaced apart from the 1st-1 light-transmitting area CA11 in the first direction, the 1st-3 light-transmitting area CA13 may be spaced apart from the 1st-2 light-transmitting area CA12 in the first direction, and the 1st-4 light-transmitting area CA14 may be spaced apart from the 1st-3 light-transmitting area CA13 in the first direction.

The second light-transmitting area CA2 may be provided in plurality. A plurality of second light-transmitting areas CA2 may be spaced apart from each other in the first direction. For example, the first light-transmitting area CA2 may include a 2nd-1 light-transmitting area CA21, a 2nd-2 light-transmitting area CA22, a 2nd-3 light-transmitting area CA23, and a 2nd-4 light-transmitting area CA24. The 2nd-2 light-transmitting area CA22 may be spaced apart from the 2nd-1 light-transmitting area CA21 in the first direction, the 2nd-3 light-transmitting area CA23 may be spaced apart from the 2nd-2 light-transmitting area CA22 in the first direction, and the 2nd-4 light-transmitting area CA24 may be spaced apart from the 2nd-3 light-transmitting area CA23 in the first direction.

The third light-transmitting area CA3 may be provided in plurality. A plurality of third light-transmitting areas CA3 may be spaced apart from each other in the first direction. For example, the third light-transmitting area CA3 may include a 3rd-1 light-transmitting area CA31, a 3rd-2 light-transmitting area CA32, a 3rd-3 light-transmitting area CA33, and a 3rd-4 light-transmitting area CA34. The 3rd-2 light-transmitting area CA32 may be spaced apart from the 3rd-1 light-transmitting area CA31 in the first direction, the 3rd-3 light-transmitting area CA33 may be spaced apart from the 3rd-2 light-transmitting area CA32 in the first direction, and the 3rd-4 light-transmitting area CA34 may be spaced apart from the 3rd-3 light-transmitting area CA33 in the first direction.

In such a structure, the 1st-1 light-transmitting area CA11, the 2nd-1 light-transmitting area CA21 and the 3rd-1 light-transmitting area CA31 may be disposed in the same row and the 1st-2 light-transmitting area CA12, the 2nd-2 light-transmitting area CA22 and the 3rd-2 light-transmitting area CA32 may be disposed in the same row, and the 1st-3 light-transmitting area CA13, the 2nd-3 light-transmitting area CA23 and the 3rd-3 light-transmitting area CA33 may be disposed in the same row, and the 1st-4 light-transmitting area CA14, the 2nd-4 light-transmitting area CA24, and the 3rd-4 light-transmitting area CA34 may be disposed in the same row.

Also, the 1st-1 light-transmitting area CA11, the 1st-2 light-transmitting area CA12, the 1st-3 light-transmitting area CA13, and the 1st-4 light-transmitting area CA14 may be disposed in the same column and the 2nd-1 light-transmitting area CA21, the 2nd-2 light-transmitting area CA22, the 2nd-3 light-transmitting area CA23, and the 2nd-4 light-transmitting area CA24 may be disposed in the same column, and the 3rd-1 light-transmitting area CA31, the 3rd-2 light-transmitting area CA32, the 3rd-3 light-transmitting area CA33, and the 3rd-4 light-transmitting area CA34 may be disposed in the same column.

The center of each of the 1st-1 light-transmitting area CA11, the 2nd-1 light-transmitting area CA21, and the 3rd-1 light-transmitting area CA31 may be disposed on a first center line CNL1 that is a virtual straight line extending in a second direction (e.g., a y axis direction). The second direction may be a direction crossing the first direction. For example, an angle between the first direction and the second direction may be 90 degrees.

In addition, the center of each of the 1st-2 light-transmitting area CA12, the 2nd-2 light-transmitting area CA22, and the 3rd-2 light-transmitting area CA32 may be disposed on a second center line CNL2 that is a virtual straight line extending in the second direction. The center of each of the 1st-3 light-transmitting area CA13, the 2nd-3 light-transmitting area CA23, and the 3rd-3 light-transmitting area CA33 may be disposed on a third center line CNL3 that is a virtual straight line extending in the second direction. The center of each of the 1st-4 light-transmitting area CA14, the 2nd-4 light-transmitting area CA24, and the 3rd-4 light-transmitting area CA34 may be disposed on a fourth center line CNL4 that is a virtual straight line extending in the second direction.

In such a structure, a plurality of first light-transmitting areas CA1, a plurality of second light-transmitting areas CA2, and a plurality of third light-transmitting areas CA3 may be arranged uniformly symmetrically. Thus, a coloring phenomenon, that occurs when the plurality of light-transmitting areas CA are irregularly arranged, may be reduced.

The first bank opening COP1 may be provided in plurality. For example, the first bank opening COP1 may include a 1st-1 bank opening COP1-1, a 1st-2 bank opening COP1-2, a 1st-3 bank opening COP1-3, a 1st-4 bank opening COP1-4, a 1st-5 bank opening COP1-5, and a 1st-6 bank opening COP1-6.

The 1st-1 bank opening COP1-1 may overlap the 1st-1 light-transmitting area CA11, and the 1st-2 bank opening COP1-2 may overlap the 1st-2 light-transmitting area CA12. The 1st-3 bank opening COP1-3 may connect the 1st-1 bank opening COP1-1 and the 1st-2 bank opening COP1-2 to each other. That is, the 1st-3 bank opening COP1-3 may be disposed between the 1st-1 bank opening COP1-1 and the 1st-2 bank opening COP1-2.

In a plan view, the 1st-1 bank opening COP1-1, the 1st-2 bank opening COP1-2, and the 1st-3 bank opening COP1-3 may surround the 1st-1 light-transmitting area CA11 and the 1st-2 light-transmitting area CA12. In a plan view, the sizes of the 1st-1 bank opening COP1-1, the 1st-2 bank opening COP1-2, and the 1st-3 bank opening COP1-3 may be greater than the sum of the sizes of the 1st-1 light-transmitting area CA11 and the 1st-2 light-transmitting area CA12.

The 1st-3 bank opening COP1-3 may have a greater length in the second direction than a length of at least one of the 1st-1 bank opening COP1-1 and the 1st-2 bank opening COP1-2 in the second direction. The length of the 1st-1 bank opening COP1-1 in the second direction and the length of the 1st-2 bank opening COP1-2 in the second direction may be the same, and the length of the 1st-3 bank opening COP1-3 in the second direction may be greater than the length of each of the 1st-1 bank opening COP1-1 and the length of the 1st-2 bank opening COP1-2 in the second direction.

The 1st-4 bank opening COP1-4 may overlap the 1st-3 light-transmitting area CA13, and the 1st-5 bank opening COP1-5 may overlap the 1st-4 light-transmitting area CA14. The 1st-6 bank opening COP1-6 may connect the 1st-4 bank opening COP1-4 and the 1st-5 bank opening COP1-5 to each other. That is, the 1st-6 bank opening COP1-6 may be disposed between the 1st-4 bank opening COP1-4 and the 1st-5 bank opening COP1-5.

In a plan view, the 1st-4 bank opening COP1-4, the 1st-5 bank opening COP1-5, and the 1st-6 bank opening COP1-6 may surround the 1st-3 light-transmitting area CA13 and the 1st-4 light-transmitting area CA14. In a plan view, the sizes of the 1st-4 bank opening COP1-4, the 1st-5 bank opening COP1-5, and the 1st-6 bank opening COP1-6 may be greater than the sum of the sizes of the 1st-3 light-transmitting area CA13 and the 1st-4 light-transmitting area CA14.

The 1st-6 bank opening COP1-6 may have a greater length in the second direction than a length of at least one of the 1st-4 bank opening COP1-4 and the 1st-5 bank opening COP1-5 in the second direction. The length of the 1st-4 bank opening COP1-4 in the second direction and the length of the 1st-5 bank opening COP1-5 in the second direction may be the same, and the length of the 1st-6 bank opening COP1-6 in the second direction may be greater than the length of each of the 1st-4 bank opening COP1-4 and the length of the 1st-5 bank opening COP1-5 in the second direction.

The second bank opening COP2 may be provided in plurality. For example, the second bank opening COP2 may include a 2nd-1 bank opening COP2-1, a 2nd-2 bank opening COP2-2, a 2nd-3 bank opening COP2-3, a 2nd-4 bank opening COP2-4, a 2nd-5 bank opening COP2-5, and a 2nd-6 bank opening COP2-6.

The 2nd-1 bank opening COP2-1 may overlap the 2nd-1 light-transmitting area CA21, and the 2nd-2 bank opening COP2-2 may overlap the 2nd-2 light-transmitting area CA22. The 2nd-3 bank opening COP2-3 may connect the 2nd-1 bank opening COP2-1 and the 2nd-2 bank opening COP2-2 to each other. That is, the 2nd-3 bank opening COP2-3 may be disposed between the 2nd-1 bank opening COP2-1 and the 2nd-2 bank opening COP2-2.

In a plan view, the 2nd-1 bank opening COP2-1, the 2nd-2 bank opening COP2-2, and the 2nd-3 bank opening COP2-3 may surround the 2nd-1 light-transmitting area CA21 and the 2nd-2 light-transmitting area CA22. In a plan view, the sizes of the 2nd-1 bank opening COP2-1, the 2nd-2 bank opening COP2-2, and the 2nd-3 bank opening COP2-3 may be greater than the sum of the sizes of the 2nd-1 light-transmitting area CA21 and the 2nd-2 light-transmitting area CA22.

The 2nd-3 bank opening COP2-3 may have a greater length in the second direction than a length of at least one of the 2nd-1 bank opening COP2-1 and the 2nd-2 bank opening COP2-2 in the second direction. The length of the 2nd-1 bank opening COP2-1 in the second direction and the length of the 2nd-2 bank opening COP2-2 in the second direction may be the same, and the length of the 2nd-3 bank opening COP2-3 in the second direction may be greater than the length of each of the 2nd-1 bank opening COP2-1 and the length of the 2nd-2 bank opening COP2-2 in the second direction.

The 2nd-4 bank opening COP2-4 may overlap the 2nd-3 light-transmitting area CA23, and the 2nd-5 bank opening COP2-5 may overlap the 2nd-4 light-transmitting area CA24. The 2nd-6 bank opening COP2-6 may connect the 2nd-4 bank opening COP2-4 and the 2nd-5 bank opening COP2-5 to each other. That is, the 2nd-6 bank opening COP2-6 may be disposed between the 2nd-4 bank opening COP2-4 and the 2nd-5 bank opening COP2-5.

In a plan view, the 2nd-4 bank opening COP2-4, the 2nd-5 bank opening COP2-5, and the 2nd-6 bank opening COP2-6 may surround the 2nd-3 light-transmitting area CA23 and the 2nd-4 light-transmitting area CA24. In a plan view, the sizes of the 2nd-4 bank opening COP2-4, the 2nd-5 bank opening COP2-5, and the 2nd-6 bank opening COP2-6 may be greater than the sum of the sizes of the 2nd-3 light-transmitting area CA23 and the 2nd-4 light-transmitting area CA24.

The 2nd-6 bank opening COP2-6 may have a greater length in the second direction than a length of at least one of the 2nd-4 bank opening COP2-4 and the 2nd-5 bank opening COP2-5 in the second direction. The length of the 2nd-4 bank opening COP2-4 in the second direction and the length of the 2nd-5 bank opening COP2-5 in the second direction may be the same, and the length of the 2nd-6 bank opening COP2-6 in the second direction may be greater than the length of each of the 2nd-4 bank opening COP2-4 and the length of the 2nd-5 bank opening COP2-5 in the second direction.

The third bank opening COP3 may be provided in plurality. For example, the third bank opening COP3 may include a 3rd-1 bank opening COP3-1, a 3rd-2 bank opening COP3-2, a 3rd-3 bank opening COP3-3, and a 3rd-4 bank opening COP3-4.

The 3rd-1 bank opening COP3-1 may overlap the 3rd-1 light-transmitting area CA31. The 3rd-2 bank opening COP3-2 may overlap the 3rd-2 transmission area CA32 and may be spaced apart from the 3rd-1 bank opening COP3-1 in the first direction. The 3rd-3 bank opening COP3-3 may overlap the 3rd-3 light-transmitting area CA33 and may be spaced apart from the 3rd-2 bank opening COP3-2 in the first direction. The 3rd-4 bank opening COP3-4 may overlap the 3rd-4 transmission area CA34 and may be spaced apart from the 3rd-3 bank opening COP3-3 in the first direction.

In a plan view, the 3rd-1 bank opening COP3-1 may surround the 3rd-1 light-transmitting area CA31, the 3rd-2 bank opening COP3-2 may surround the 3rd-2 light-transmitting area CA32, the 3rd-3 bank opening COP3-3 may surround the 3rd-3 light-transmitting area CA33, and the 3rd-4 bank opening COP3-4 may surround the 3rd-4 light-transmitting area CA34. In a plan view, the size of the 3rd-1 bank opening COP3-1 may be greater than the size of the 3rd-1 light-transmitting area CA31, and the size of the 3rd-2 bank opening COP3-2 may be greater than the size of the 3rd-2 light-transmitting area CA32, and the size of the 3rd-3 bank opening COP3-3 may be greater than the size of the 3rd-3 light-transmitting area CA33, and the size of the 3rd-4 bank opening COP3-4 may be greater than the size of the 3rd-4 light-transmitting area CA34.

The 2nd-3 bank opening COP2-3 may protrude from the 2nd-1 bank opening COP2-1 and the 2nd-2 bank opening COP2-2 in the second direction (e.g., a-y axis direction) toward the third bank opening COP3. At least a part of the 2nd-3 bank opening COP2-3 may be disposed between the 3rd-1 bank opening COP3-1 and the 3rd-2 bank opening COP3-2. The 2nd-6 bank opening COP2-6 may protrude from the 2nd-4 bank opening COP2-4 and the 2nd-5 bank opening COP2-5 in the second direction (e.g., the −y axis direction) toward the third bank opening COP3. At least a part of the 2nd-6 bank opening COP2-6 may be disposed between the 3rd-3 bank opening COP3-3 and the 3rd-4 bank opening COP3-4. In such a structure, the 2nd-3 bank opening COP2-3 and the 2nd-6 bank opening COP may be space-efficiently arranged.

Figure 5:
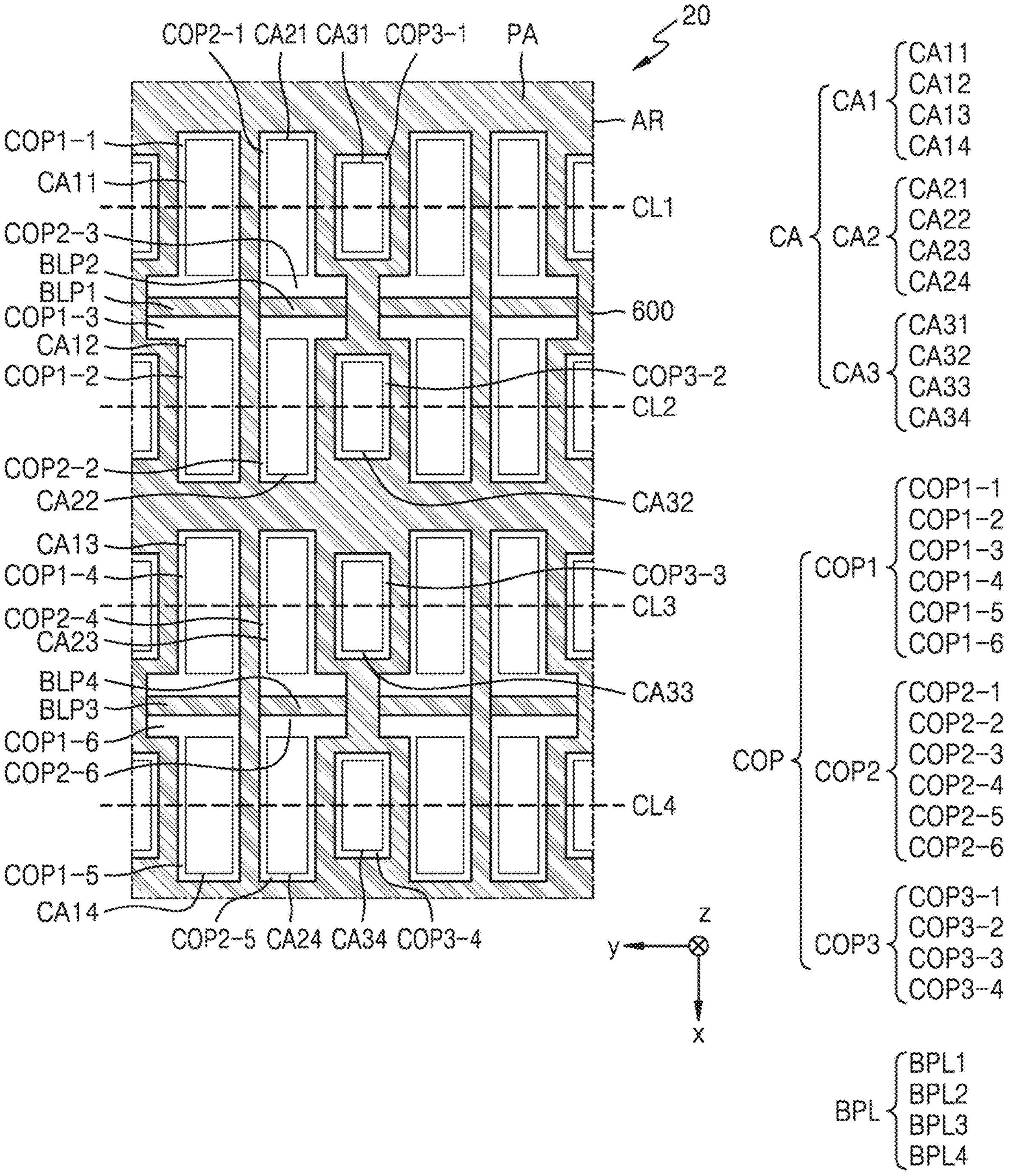
FIG. 5 is a plan view schematically illustrating a part of a color conversion panel according to an embodiment.

FIG. 5 is a plan view schematically illustrating a part of the color conversion panel 20 according to an embodiment. Specifically, FIG. 5 may correspond to a portion AR of FIG. 1.

In FIG. 5, the same reference numerals as those of FIG. 4 represent same elements and thus, redundant descriptions therewith are omitted.

Referring to FIGS. 3 and 5, the color conversion panel 20 may include a cover part BLP. The cover part BLP may be provided in plurality. For example, the cover part BLP may include a first cover part BLP1, a second cover part BLP2, a third cover part BLP3, and a fourth cover part BLP4.

The first cover part BLP1 may be arranged in the 1st-3 bank opening COP1-3, may extend in the second direction and may be connected to the bank 600. In a plan view, the 1st-3 bank opening COP1-3 may be divided into two parts by the first cover part BLP1. The first cover part BLP1 may reduce a phenomenon of mixing colors of light passing through the 1st-1 bank opening COP1-1 and the 1st-2 bank opening COP1-2.

The second cover part BLP2 may be arranged in the 2nd-3 bank opening COP2-3, may extend in the second direction and may be connected to the bank 600. In a plan view, the 2nd-3 bank opening COP2-3 may be divided into two parts by the second cover part BLP2. The second cover part BLP2 may reduce a phenomenon of mixing colors of light passing through the 1st-4 bank opening COP1-4 and the 1st-5 bank opening COP1-5.

The third cover part BLP3 may be arranged in the 1st-6 bank opening COP1-6, may extend in the second direction and may be connected to the bank 600. In a plan view, the 1st-6 bank opening COP1-6 may be divided into two parts by the third cover part BLP3. The third cover part BLP3 may reduce a phenomenon of mixing colors of lights passing through the 2nd-1 bank opening COP2-1 and the 2nd-2 bank opening COP2-2.

The fourth cover part BLP4 may be arranged in the 2nd-6 bank opening COP2-6, may extend in the second direction and may be connected to the bank 600. In a plan view, the 2nd-6 bank opening COP2-6 may be divided into two parts by the fourth cover part BLP4. The fourth cover part BLP4 may reduce a phenomenon of mixing colors of lights passing through the 2nd-4 bank opening COP2-4 and the 2nd-5 bank opening COP2-5.

Each of a plurality of cover parts BLP may include the same material as the bank 600. For example, the first cover part BLP1, the second cover part BLP2, the third cover part BLP3, and the fourth cover part BLP4 may include the same material as the bank layer 600. Each of the first cover part BLP1, the second cover part BLP2, the third cover part BLP3, and the fourth cover part BLP4 may include a liquid-repellent material.

Figure 6:
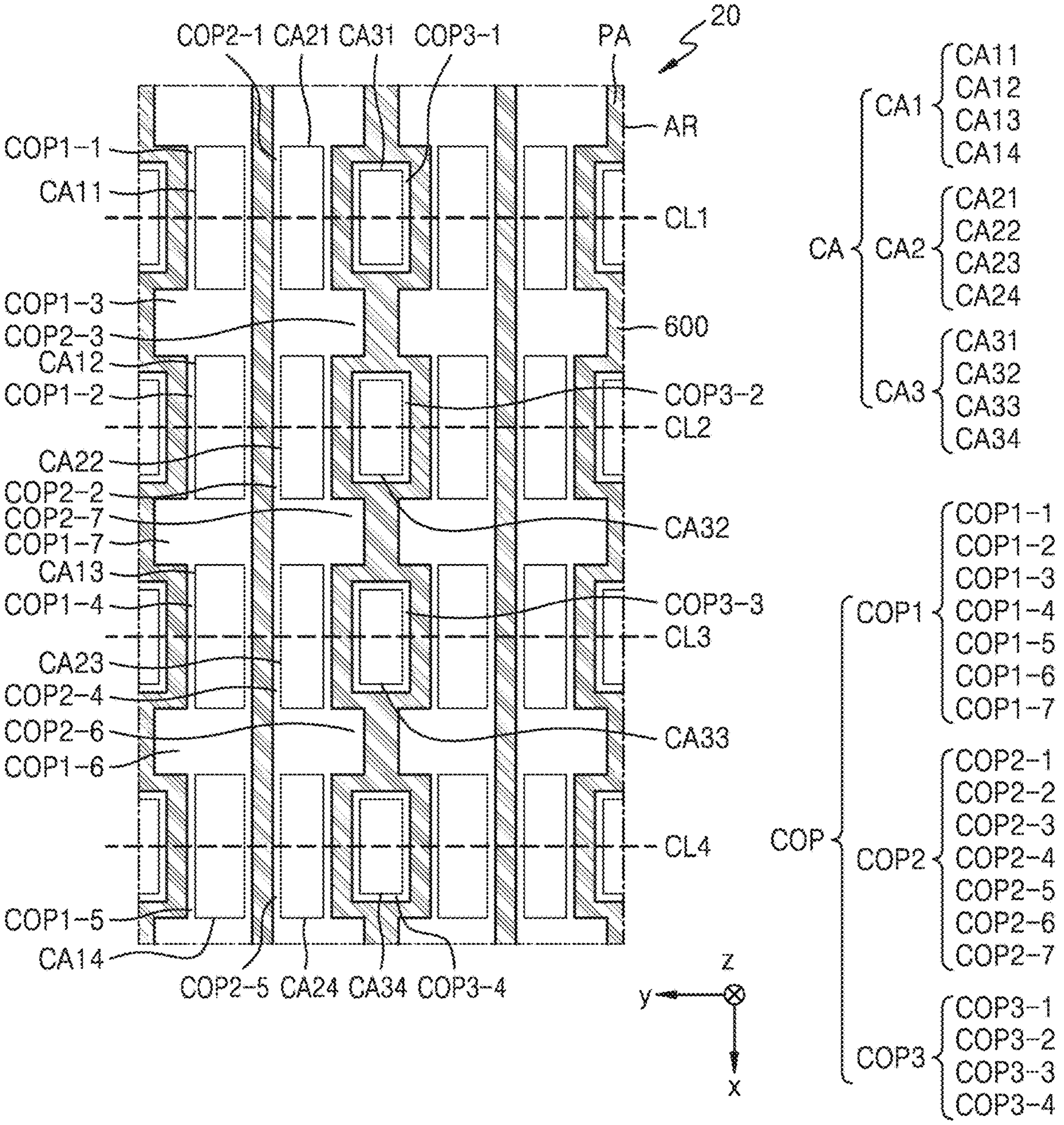
FIG. 6 is a plan view schematically illustrating a part of a color conversion panel according to an embodiment.

FIG. 6 is a plan view schematically illustrating a part of the color conversion panel 20 according to an embodiment. Specifically, FIG. 6 may correspond to a portion AR of FIG. 1.

In FIG. 6, the same reference numerals as those of FIG. 4 represent same elements and thus, redundant descriptions therewith are omitted.

Referring to FIGS. 3 and 6, the first bank opening COP1 may further include a 1st-7 bank opening COP1-7, and the second bank opening COP2 may further include a 2nd-7 bank opening COP2-7.

The 1st-7 bank opening COP1-7 may connect the 1st-2 bank opening COP1-2 and the 1st-4 bank opening COP1-4 to each other. That is, the 1st-7 bank opening COP1-7 may be disposed between the 1st-2 bank opening COP1-2 and the 1st-4 bank opening COP1-4.

The 1st-7 bank opening COP1-7 may have a greater length in the second direction than a length of at least one of the 1st-2 bank opening COP1-2 and the 1st-4 bank opening COP1-4 in the second direction. The length of the 1st-2 bank opening COP1-2 in the second direction and the length of the 1st-4 bank opening COP1-4 in the second direction may be the same, and the length of the 1st-7 bank opening COP1-7 in the second direction may be greater than the length of each of the 1st-2 bank opening COP1-2 and the length of the 1st-4 bank opening COP1-4 in the second direction.

The 2nd-7 bank opening COP2-7 may connect the 2nd-2 bank opening COP2-2 and the 2nd-4 bank opening COP2-4 to each other. That is, the 2nd-7 bank opening COP2-7 may be disposed between the 2nd-2 bank opening COP2-2 and the 2nd-4 bank opening COP2-4.

The 2nd-7 bank opening COP2-7 may have a greater length in the second direction than a length of at least one of the 2nd-2 bank opening COP2-2 and the 2nd-4 bank opening COP2-4 in the second direction. The length of the 2nd-2 bank opening COP2-2 in the second direction and the length of the 2nd-4 bank opening COP2-4 in the second direction may be the same, and the length of the 2nd-7 bank opening COP2-7 in the second direction may be greater than the length of each of the 2nd-2 bank opening COP2-2 and the length of the 2nd-4 bank opening COP2-4 in the second direction.

The 2nd-7 bank opening COP2-7 may protrude from the 2nd-2 bank opening COP2-2 and the 2nd-4 bank opening COP2-4 in the second direction (e.g., the −y axis direction) toward the third bank opening COP3. At least a part of the 2nd-7 bank opening COP2-7 may be disposed between the 3rd-2 bank opening COP3-2 and the 3rd-3 bank opening COP3-3.

FIGS. 7A through 7D are cross-sectional views illustrating a structure of a first light-emitting element according to an embodiment.

Referring to FIGS. 7A through 7D, the first light-emitting element, the second light-emitting element, and the third light-emitting element described above may have the same structure. Hereinafter, for convenience of explanation, the structure of the first light-emitting element will be described in detail.

In an embodiment, the intermediate layer 220 included in the first light-emitting element described above may include two or more emitting units sequentially stacked between the first sub-pixel electrode 210R and the opposite electrode 230, and a charge generation layer (CGL) disposed between the two emitting units. When the intermediate layer 220 includes an emitting unit and a CGL, the first light-emitting element may be a tandem light-emitting device. The first light-emitting element may have a stack structure of a plurality of emitting units, thereby enhancing color purity and emission efficiency.

One emitting unit may include an emission layer with a first functional layer below the emission layer and a second functional layer above the emission layer. The charge generation layer CGL may include a negative charge generation layer CGL and a positive charge generation layer CGL. The emission efficiency of the first light-emitting element, which is a tandem light-emitting device having a plurality of emission layers, may be further increased by the negative charge generation layer CGL and the positive charge generation layer CGL.

The negative charge generation layer CGL may be an n-type charge generation layer CGL. The negative charge generation layer CGL may supply electrons. The negative charge generation layer CGL may include a host and a dopant. The host may include an organic material. The dopant may include a metal material. The positive charge generation layer CGL may be a p-type charge generation layer CGL. The positive charge generation layer CGL may supply holes. The positive charge generation layer CGL may include a host and a dopant. The host may include an organic material. The dopant may include a metal material.

Figure 7A:
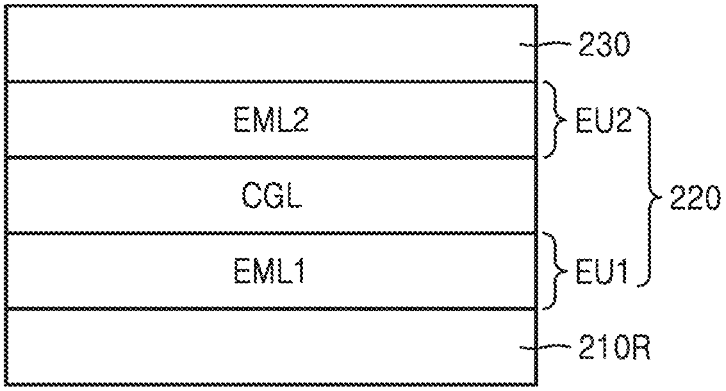
FIGS. 7A through 7D are cross-sectional views illustrating a structure of a first light-emitting element according to an embodiment.

In an embodiment, as shown in FIG. 7A, the first light-emitting element may include a first emitting unit EU1 including a first emission layer EML1 and a second emitting unit EU2 including a second emission layer EML2 that are sequentially stacked. A charge generation layer CGL may be provided between the first emitting unit EU1 and the second emitting unit EU2. For example, the first light-emitting element may include a first sub-pixel electrode 21R, a first emission layer EML1, a charge generation layer CGL, a second emission layer EML2, and an opposite electrode 230, which are sequentially stacked. A first functional layer and a second functional layer may be included below and above the first emission layer EML1. A first functional layer and a second functional layer may be included below and above the second emission layer EML2. The first emission layer EML1 may be a blue emission layer, and the second emission layer EML2 may be a yellow emission layer.

Figure 7B:
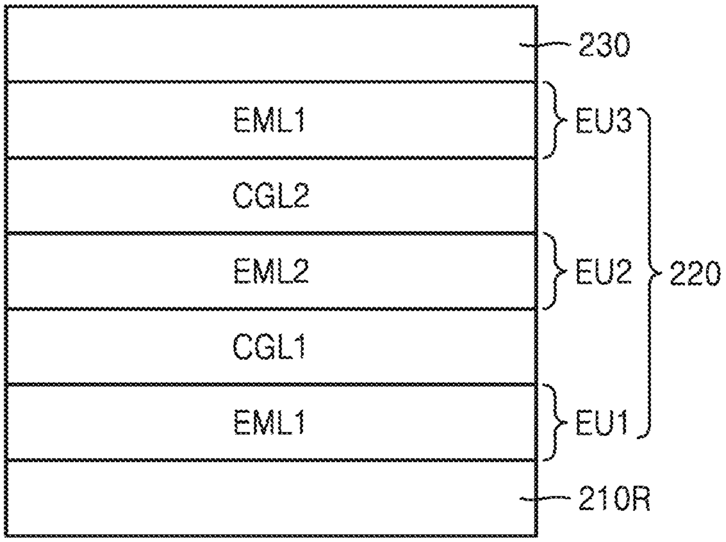

In an embodiment, as shown in FIG. 7B, the first light-emitting element may include a first emitting unit EU1 and a third emitting unit EU3 both of which include a first emission layer EML1, and a second emitting unit EU2 including a second emission layer EML2. A first charge generation layer CGL1 may be provided between the first emitting unit EU1 and the second emitting unit EU2, and a second charge generation layer CGL2 may be provided between the second emitting unit EU2 and the third emitting unit EU3. For example, the first light-emitting element may include a first sub-pixel electrode 210R, a first emission layer EML1, a first charge generation layer CGL1, a second emission layer EML2, a second charge generation layer CGL2, a first emission layer EML1, and an opposite electrode 230 that are sequentially stacked. A first functional layer and a second functional layer may be included below and above the first emission layer EML1. A first functional layer and a second functional layer may be included below and above the second emission layer EML2. The first emission layer EML1 may be a blue emission layer, and the second emission layer EML2 may be a yellow emission layer.

In an embodiment, the first light-emitting element may further include the second emitting unit EU2 which comprises the second emission layer EML2, and a third emission layer EML3 or a fourth emission layer EML4 which directly contacts the second emission layer EML2 in an upper or a lower surface of the second emission layer EML2. Here, directly contact may mean that another layer is not disposed between the second emission layer EML2 and the third emission layer EML3, or between the second emission layer EML2 and the fourth emission layer EML4. The third emission layer EML3 may be a red emission layer, and the fourth emission layer EML4 may be a green emission layer.

Figure 7C:
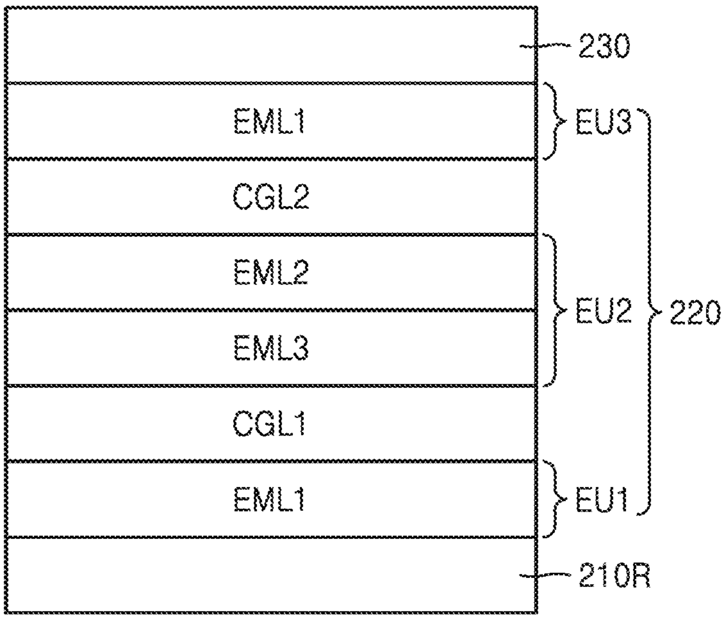
Figure 7D:
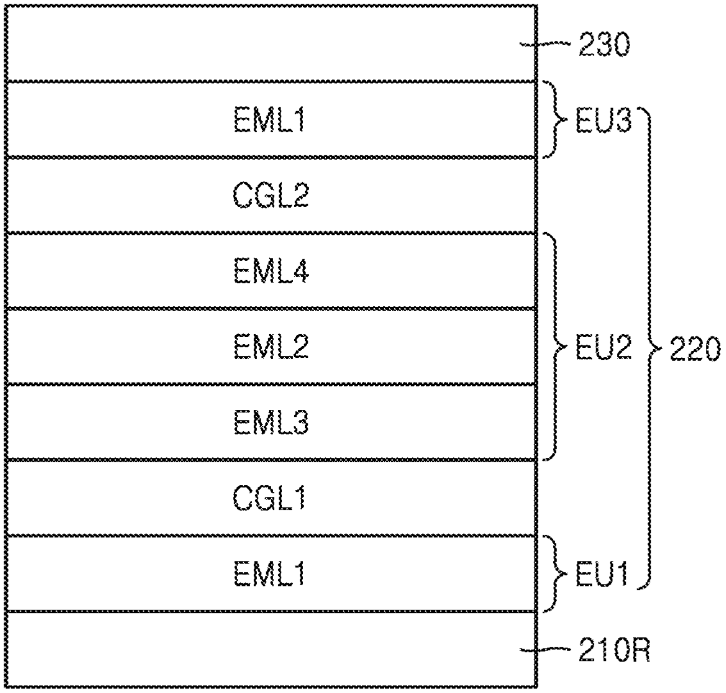

For example, as shown in FIG. 7C, the first light-emitting element may include a first sub-pixel electrode 210R, a first emission layer EML1, a first charge generation layer CGL1, a third emission layer EML3, a second emission layer EML2, a second charge generation layer CGL2, a first emission layer EML1, and an opposite electrode 230 that are sequentially stacked. In another example, as shown in FIG. 7D, the first light-emitting element may include a first sub-pixel electrode 210R, a first emission layer EML1, a first charge generation layer CGL1, a third emission layer EML3, a second emission layer EML2, a fourth emission layer EML4, a second charge generation layer CGL2, a first emission layer EML1, and an opposite electrode 230 that are sequentially stacked.

Figure 8A:
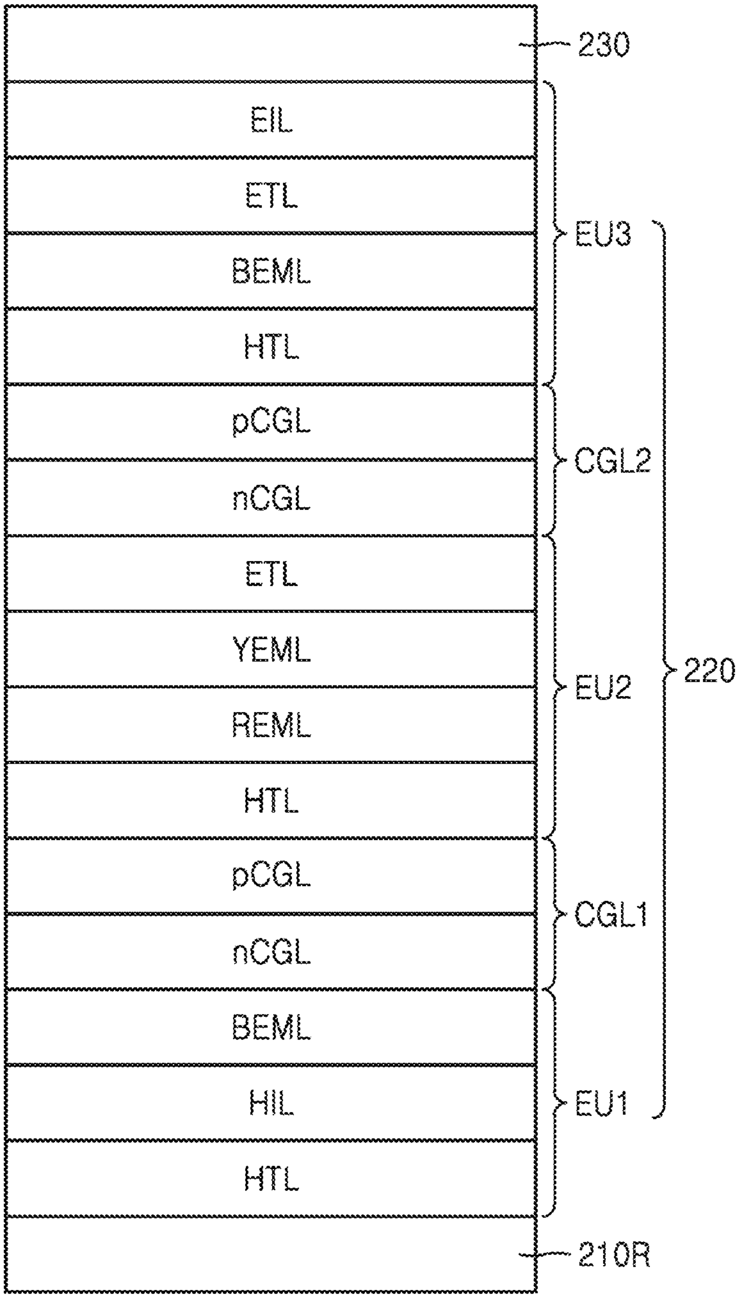
FIG. 8A is a cross-sectional view illustrating an example of a first light-emitting element of FIG. 7C.
Figure 8B:
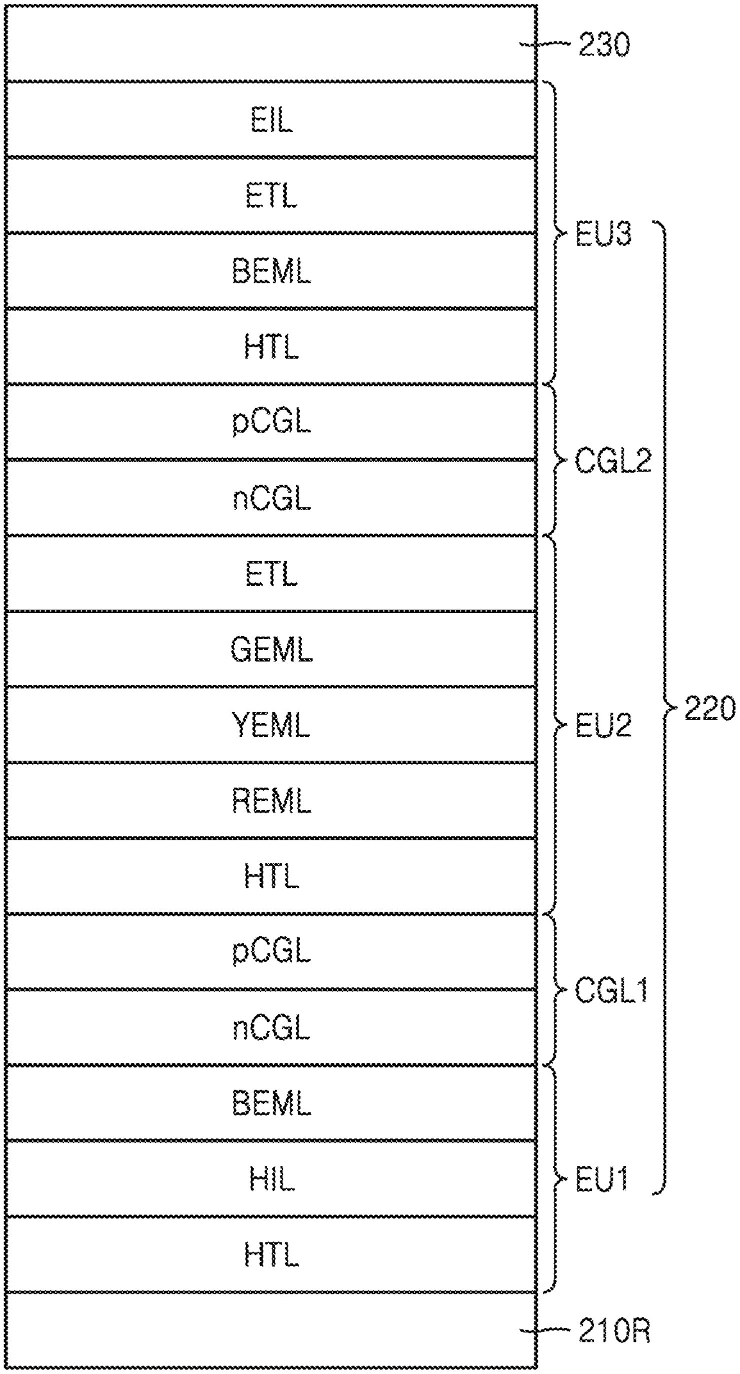
FIG. 8B is a cross-sectional view illustrating an example of a first light-emitting element of FIG. 7D.

FIG. 8A is a cross-sectional view illustrating an example of the first light-emitting element of FIG. 7C. FIG. 8B is a cross-sectional view illustrating an example of the first light-emitting element of FIG. 7D.

Referring to FIG. 8A, the first light-emitting element may include a first emitting unit EU1, a second emitting unit EU2, and a third emitting unit EU3 that are sequentially stacked. A first charge generation layer CGL1 may be provided between the first emitting unit EU1 and the second emitting unit EU2, and a second charge generation layer CGL2 may be provided between the second emitting unit EU2 and the third emitting unit EU3. Each of the first charge generation layer CGL1 and the second charge generation layer CGL2 may include a negative charge generation layer nCGL and a positive charge generation layer pCGL.

The first emitting unit EU1 may include a blue emission layer BEML. The first emitting unit EU1 may further include a HIL and a HTL between the first sub-pixel electrode 210R and the blue emission layer BEML. In an embodiment, a p-doping layer may be further included between the HIL and the HTL. The p-doping layer may be formed by doping the HIL with a p-type doping material. In an embodiment, at least one of a blue light auxiliary layer, an electron blocking layer, and a buffer layer may be further included between the blue emission layer BEML and the HTL. A blue light auxiliary layer may increase light emission efficiency of the blue emission layer BEML. The blue light auxiliary layer may adjust a hole charge balance to increase light emission efficiency of the blue emission layer BEML. The electron blocking layer may prevent electron injection into the HTL. The buffer layer may compensate for a resonance distance according to the wavelength of light emitted from the emission layer.

The second emitting unit EU2 may include a yellow emission layer YEML, and a red emission layer REML directly in contact with the yellow emission layer YEML and disposed below the yellow emission layer YEML. The second emitting unit EU2 may further include a HTL between the positive charge generation layer pCGL of the first charge generation layer CGL1 and the red emission layer REML, and may further include an electron transport layer (ETL) between the yellow emission layer YEML and the second charge generation layer CGL2.

The third emitting unit EU3 may include a blue emission layer BEML. The third emitting unit EU3 may further include a HTL between the positive charge generation layer pCGL of the second charge generation layer CGL2 and the blue emission layer BEML. The third emitting unit EU3 may further include an electron transport layer (ETL) and an electron injection layer (EIL) between the blue emission layer BEML and the opposite electrode 230. The ETL may be a single layer or multiple layers. In an embodiment, at least one of a blue light auxiliary layer, an electron blocking layer, and a buffer layer may be further included between the blue emission layer BEML and the HTL. At least one of a hole blocking layer and a buffer layer may be further included between the blue emission layer BEML and the ETL. The hole blocking layer may prevent electron injection into the HTL.

In the first light-emitting element shown in FIG. 8B, the stack structure of the second emitting unit EU2 is different from that of the first light-emitting element shown in FIG. 8A, and the other configuration is the same. Referring to FIG. 8B, the second emitting unit EU2 may include a yellow emission layer YEML, a red emission layer REML directly in contact with the yellow emission layer YEML below the yellow emission layer YEML, and a green emission layer GEML directly in contact with the yellow emission layer YEML above the yellow emission layer YEML. The second emitting unit EU2 may further include a HTL between the positive charge generation layer pCGL of the first charge generation layer CGL1 and the red emission layer REML, and may further include an ETL between the green emission layer GEML and the negative charge generation layer nCGL of the second charge generation layer CGL2.

Figure 9:
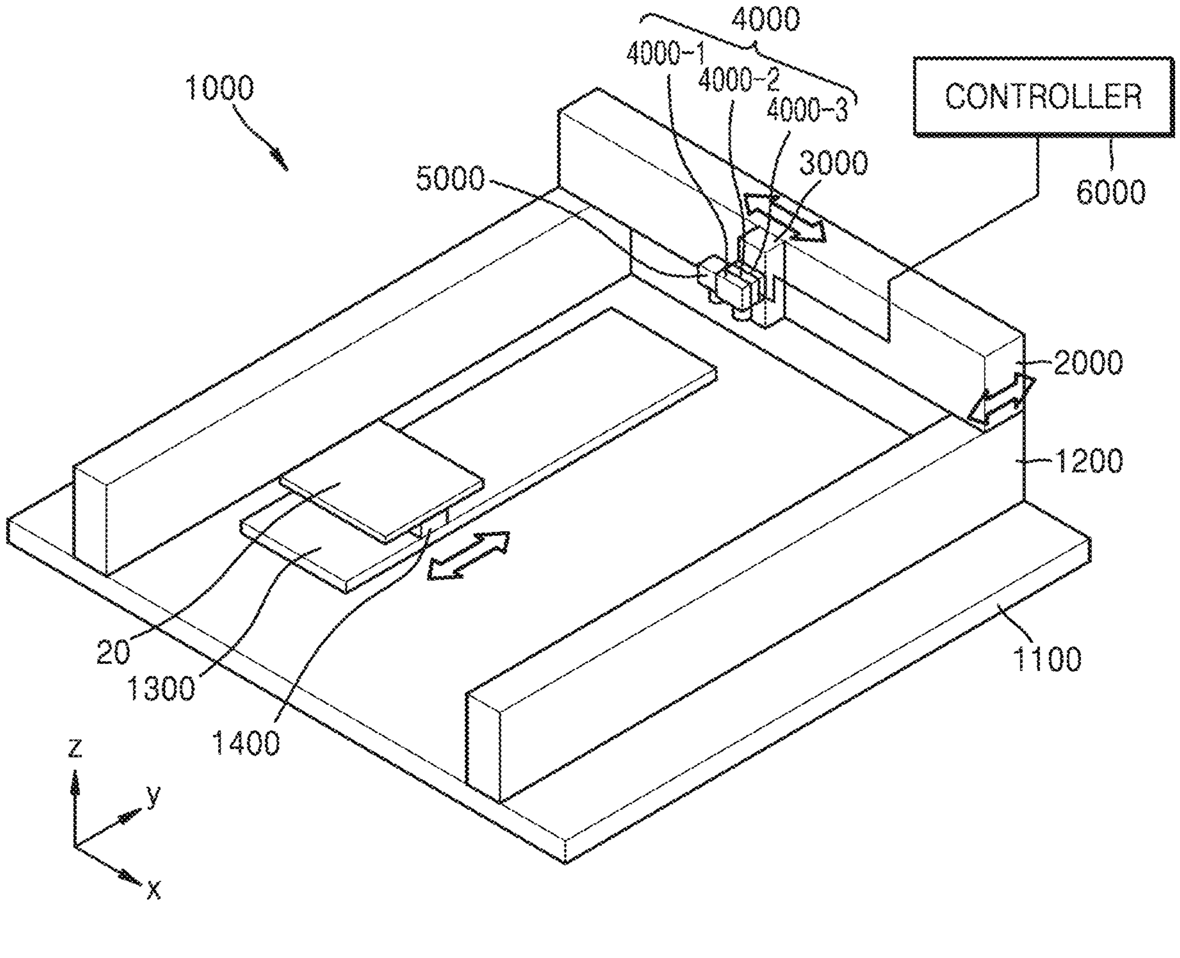
FIG. 9 is a perspective view schematically illustrating an apparatus for manufacturing a display device according to an embodiment.

FIG. 9 is a perspective view schematically illustrating an apparatus 1000 for manufacturing a display device according to an embodiment.

Referring to FIG. 9, the apparatus 1000 for manufacturing the display device may include a stage 1100, a gantry 2000, a moving unit 3000, a liquid droplet ejecting unit 4000, and a controller 6000.

The stage 1100 may include a guide member 1200 and a substrate moving member 1300. The stage 1100 may include an alignment mark (not shown) for aligning the color conversion panel 20. Here, the color conversion panel 20 may be the color conversion panel 20 described with reference to FIGS. 1 through 6. In this case, the apparatus 1000 for manufacturing the display device may form a functional layer (see 700 of FIG. 3) on the color conversion panel 20.

The guide members 1200 may be spaced apart from on either side of the substrate moving member 1300. The gantry 2000 may be disposed on the guide member 1200. In an embodiment, the guide member 1200 may include a constant rail so that the gantry 2000 may make a linear motion in a longitudinal direction of the guide member 1200. In particular, the guide member 1200 may include a linear motion rail.

The substrate moving member 1300 may be disposed on the stage 1100 and may include a substrate rotation member 1400. The substrate moving member 1300 may extend in the longitudinal direction of the guide member 1200. For example, referring to FIG. 9, the substrate moving member 1300 may extend in the second direction (e.g., a y axis direction). In addition, the substrate moving member 1300 may include a rail through which the substrate rotating member 1400 may make a linear motion. In particular, the substrate moving member 1300 may include a linear motion rail.

The substrate rotating member 1400 may rotate on the substrate moving member 1300. When the substrate rotating member 1400 rotates, the color conversion panel 20 disposed on the substrate rotating member 1400 may rotate. In an embodiment, the substrate rotating member 1400 may rotate around a rotation axis perpendicular to a first surface of the stage 1100 on which the color conversion panel 20 is seated. When the substrate rotating member 1400 rotates around the rotation axis perpendicular to the first surface of the stage 1100 on which the color conversion panel 20 is seated, the color conversion panel 20 disposed on the substrate rotating member 1400 may rotate around the rotation axis perpendicular to the first surface of the stage 1100 on which the color conversion panel 20 is seated.

The gantry 2000 may be disposed on the guide member 1200. That is, the gantry 2000 may be disposed on the guide members 1200 spaced apart on either side of the substrate moving member 1300.

The gantry 2000 may move in the longitudinal direction of the guide member 1200. In an embodiment, the gantry 2000 may make a linear motion manually or make a linear motion automatically by including a motor cylinder or the like. For example, the gantry 2000 may make a linear motion automatically by including a linear motion block that moves along the linear motion rail.

The moving unit 3000 and the liquid droplet ejecting unit 4000 that ejects liquid droplets may be arranged on the gantry 2000. In an embodiment, the moving unit 3000 may make a linear motion on the gantry 2000. For example, the gantry 2000 may include a constant rail through which the moving unit 3000 may make a linear motion.

The moving unit 3000 may include at least one nozzle moving unit. The liquid droplet ejecting unit 4000 may include at least one ejecting unit, and the at least one ejecting unit may be arranged in various ways. In this case, the moving unit 3000 may make a linear motion on the gantry 2000, and the liquid droplet ejecting unit 4000 may be arranged on the moving unit 3000 and may supply the liquid droplets to the color conversion panel 20. For example, the nozzle moving unit and the ejecting unit may be provided one by one. In this case, the ejecting unit may include at least one or more nozzle heads for ejecting liquid droplets.

In another example, at least one or more ejecting units may be provided, and one nozzle moving unit may be provided. In this case, when the ejecting unit is provided in plurality, a plurality of ejecting units may be disposed in one nozzle moving unit, and the plurality of ejecting units may be simultaneously moved by the movement of the nozzle moving unit.

In another example, the nozzle moving unit and the ejecting unit may be provided in plurality. In this case, at least one or more ejecting units may be arranged in one nozzle moving unit. Hereinafter, for convenience of explanation, the case where one nozzle moving unit and an ejecting unit are arranged, will be described in detail.

The moving unit 3000 may make a linear motion on the gantry 2000. Specifically, the moving unit 3000 may move in the lengthwise direction of the gantry 2000. For example, the moving unit 3000 may move in the first direction (e.g., an x axis direction).

In an embodiment, the moving unit 3000 may make a linear motion manually. In an embodiment, the moving unit 3000 may make a linear motion automatically by including a motor, a cylinder, etc. For example, the moving unit 3000 may include a linear motion block that moves along the linear motion rail. Hereinafter, for convenience of explanation, a case where the moving unit 3000 makes a linear motion automatically, will be described in detail.

The ejecting unit of the liquid droplet ejecting unit 4000 may be disposed in the nozzle moving unit of the moving unit 3000. In this case, the ejecting unit of the liquid droplet ejecting unit 4000 may supply liquid droplets to the color conversion panel 20. In this case, the ejecting unit of the liquid droplet ejecting unit 4000 may supply various materials to the color conversion panel 20. For example, the liquid droplet ejecting unit 4000 may include a first nozzle moving unit 3000*a*, a second nozzle moving unit 3000*b*, and a third nozzle moving unit 3000*c*, which are arranged in a line.

In the above case, at least one of the first ejecting unit 4000-1, the second ejecting unit 4000-2, and the third ejecting unit 4000-3 may include at least one nozzle ejecting liquid droplets. Hereinafter, for convenience of explanation, each of the first ejecting unit 4000-1, the second ejecting unit 4000-2 and the third ejecting unit 4000-3 include a plurality of nozzles, will be described in detail.

The liquid droplet ejecting unit 4000 may eject liquid droplets toward the color conversion panel 20. In this case, the liquid droplets may include a scattering body and a base resin.

The amount of the liquid droplets independently ejected by each of the first ejecting unit 4000-1, the second ejecting unit 4000-2, and the third ejecting unit 4000-3 may be adjusted. In this case, each of the first ejecting unit 4000-1, the second ejecting unit 4000-2, and the third ejecting unit 4000-3 may be electrically connected to the control unit 6000. Thus, the amount of the liquid droplets ejected by each of the first ejecting unit 4000-1, the second ejecting unit 4000-2, and the third ejecting unit 4000-3 may be adjusted by the controller 6000.

In the above case, materials ejected by the first ejecting unit 4000-1, the second ejecting unit 4000-2, and the third ejecting unit 4000-3 may be different from each other. For example, the first ejecting unit 4000-1 may provide a first material for forming a first quantum dot layer, the second ejecting unit 4000-2 may provide a second material for forming a second quantum dot layer, and the third ejecting unit 4000-3 may provide a third material for forming a third quantum dot layer.

A measurement unit 5000 may capture an image of the color conversion panel 2 0 or an image of an opening of the color conversion panel 20. The measurement unit 5000 may be a confocal microscope or an interferometric microscope.

The confocal microscope may obtain various two-dimensional images of an object with different depths, and is a microscope that reconfigures a three-dimensional structure of the object based these two-dimensional images. The confocal microscope may be, for example, a chromatic confocal microscope, chromatic line confocal microscope, or the like. Interferometric microscope is a microscope that measures and quantified by observing changes in the microstructure of the object and changes in phase. The interferometric microscope may be, for example, a laser interferometric microscope, a white light interferometric microscope, or the like. In an embodiment, the measurement unit 5000 may include the lighting (not shown), a lens (not shown), and a camera (not shown). In this case, the measurement unit 5000 may be disposed in the shape of the lighting, the lens and the camera from a portion close to the liquid droplets DS. The measurement unit 5000 is not limited thereto and may include all devices and structures for capturing an image of the liquid droplets DS. Hereinafter, for convenience of explanation, the case where the measurement unit 5000 includes the lighting, the lens and the camera, will be described in detail.

The controller 6000 may control the position of the liquid droplet ejecting unit 4000 based on the image captured by the measurement unit 5000. For example, the controller 6000 may control the position of the liquid droplet ejecting unit 4000, the type of liquid droplets supplied by each nozzle, the amount of liquid droplets, and the like.

When a display device is manufactured using the apparatus for manufacturing the display device, the apparatus 1000 for manufacturing the display device may manufacture the color conversion panel 20. In this case, as described above, after the color conversion panel 20 is disposed on the stage 1100, the position of the color conversion panel 20 and the position of the liquid droplet ejecting unit 4000 may correspond to each other. In this case, the gantry 2000 and the substrate moving member 1300 may be controlled so that the position of the color conversion panel 20 may correspond to a preset position based on the image captured by the measurement unit 5000.

After the above procedure is completed, the controller 6000 may supply liquid droplets to the color conversion panel 20 through the liquid droplet ejecting unit 4000 while making a relative motion of the color conversion panel 20 and the liquid droplet ejecting unit 4000 in the first direction. In an embodiment, the controller 6000 may allow the color conversion panel 20 to make a linear motion by making a linear motion of the substrate rotating member 1400 through the substrate moving member 1300 in a state in which the position of the liquid droplet ejecting unit 4000 is fixed. In an embodiment, the gantry 2000 is made a linear motion in the state in which the position of the color conversion panel 20 is fixed, so that the liquid droplet ejecting unit 4000 may make a linear motion. In an embodiment, the controller 6000 may also allow the color conversion panel 20 and the liquid droplet ejecting unit 4000 to make a linear motion in opposite directions through the substrate moving member 1300 and the gantry 2000.

In the above case, the liquid droplet ejecting unit 4000 may supply at least one of the first material, the second material, and the third material of the color conversion panel 20. When the above procedure is completed, after the second capping layer (see CL2 of FIG. 3) is formed on the color conversion panel 20, the color conversion panel 20 may be combined with the display panel 10.

Referring to FIGS. 3 through 6 and FIG. 9, the liquid droplet ejecting unit 4000 may supply the liquid droplets to the bank opening COP. Specifically, the liquid droplet ejecting unit 4000 may supply the liquid droplets to the 1st-3 bank opening COP1-3, a 1st-6 bank opening COP1-6, a 2nd-3 bank opening COP2-3, and a 2nd-6 bank opening COP2-6.

The liquid droplets supplied to the 1st-3 bank opening COP1-3 may flow into the 1st-1 bank opening COP1-1 and the 1st-2 bank opening COP1-2. Thus, a functional layer 700 may be disposed in the 1st-1 bank opening COP1-1, the 1st-2 bank opening COP1-2 and the 1st-3 bank opening COP1-3.

The liquid droplets supplied to the 1st-6 bank opening COP1-6 may flow into the 1st-4 bank opening COP1-4 and the 1st-5 bank opening COP1-5. Thus, a functional layer 700 may be disposed in the 1st-4 bank opening COP1-4, the 1st-5 bank opening COP1-5 and the 1st-6 bank opening COP1-6.

The liquid droplets supplied to the 2nd-3 bank opening COP2-3 may flow into the 2nd-1 bank opening COP2-1 and the 2nd-2 bank opening COP2-2. Thus, a functional layer 700 may be disposed in the 2nd-1 bank opening COP2-1, the 2nd-2 bank opening COP2-2 and the 2nd-3 bank opening COP2-3.

The liquid droplets supplied to the 2nd-6 bank opening COP2-6 may flow into the 2nd-4 bank opening COP2-4 and the 2nd-5 bank opening COP2-5. Thus, a functional layer 700 may be disposed in the 2nd-4 bank opening COP2-4, the 2nd-5 bank opening COP2-5 and the 2nd-6 bank opening COP2-6.

The functional layer 700 disposed in the third bank opening COP3 may be formed through an additional photolithography process (not using the apparatus for manufacturing the display device described with reference to FIG. 9).

In the embodiment described with reference to FIG. 5, since a plurality of cover parts BLP includes a liquid-repellent material, even when liquid droplets are supplied onto the first cover part BLP1, the second cover part BLP2, the third cover part BLP3 and the fourth cover part BLP4, the liquid droplets may be supplied to the 1st-1 bank opening COP1-1, the 1st-2 bank opening COP1-2, the 1st-4 bank opening COP1-4, the 1st-5 bank opening COP1-5, the 2nd-1 bank opening COP2-1, the 2nd-2 bank opening COP2-2, the 2nd-4 bank opening COP2-4, and the 2nd-5 bank opening COP2-5.

In the embodiment described with reference to FIG. 6, the liquid droplets may be supplied to the 1st-7 bank opening COP1-7 and the 2nd-7 bank opening COP2-7. Thus, a process time for disposing the functional layer 700 in the first bank opening COP1 and the second bank opening COP2 may be reduced.

According to an embodiment of the present disclosure, the image quality of a display device may be enhanced, and manufacturing costs may be reduced.

The effects of the disclosure are not limited to the aforementioned features of the present disclosure, and other effects not mentioned can be clearly understood by a person skilled in the art from the following description.

It should be understood that embodiments described herein should be considered in a descriptive sense only and not for purposes of limitation. Descriptions of features or aspects within each embodiment should typically be considered as available for other similar features or aspects in other embodiments. While the present disclosure has been described with reference to the drawings and embodiments thereof, it will be understood by those of ordinary skill in the art that various changes in form and details may be made thereto without departing from the spirit and scope of the present disclosure as set forth and defined by the following claims.

What is claimed is:

1. A display device comprising:

a display panel comprising a first light-emitting element, a second light-emitting element, and a third light-emitting element; and a color conversion panel disposed on the display panel, wherein the color conversion panel comprises:

an upper substrate comprising a first light-transmitting area overlapping the first light-emitting element, a second light-transmitting area overlapping the second light-emitting element, and a third light-transmitting area overlapping the third light-emitting element;

a color filter layer disposed under the upper substrate and comprising a first color filter overlapping the first light-transmitting area, a second color filter overlapping the second light-transmitting area, and a third color filter overlapping the third light-transmitting area; and a bank disposed under the color filter layer and comprising a first bank opening overlapping the first light-transmitting area, a second bank opening overlapping the second light-transmitting area, and a third bank opening overlapping the third light-transmitting area, wherein the first light-transmitting area comprises a 1st-1 light-transmitting area and a 1st-2 light-transmitting area spaced apart from the 1st-1 light-transmitting area in a first direction, and the first bank opening comprises a 1st-1 bank opening overlapping the 1st-1 light-transmitting area, a 1st-2 bank opening overlapping the 1st-2 light-transmitting area, and a 1st-3 bank opening connecting the 1st-1 bank opening and the 1st-2 bank opening to each other, and wherein the 1st-3 bank opening has a greater length in a second direction crossing the first direction than a length of at least one of the 1st-1 bank opening and the 1st-2 bank opening in the second direction.

2. The display device of claim 1, wherein the second light-transmitting area comprises a 2nd-1 light-transmitting area, and a 2nd-2 light-transmitting area spaced apart from the 2nd-1 light-transmitting area in the first direction, and the third light-transmitting area comprises a 3rd-1 light-transmitting area, and a 3rd-2 light-transmitting area spaced apart from the 3rd-1 light-transmitting area in the first direction.

3. The display device of claim 2, wherein a center of each of the 1st-1 light-transmitting area, the 2nd-1 light-transmitting area and the 3rd-1 light-transmitting area is disposed on a first center line that is a virtual straight line extending in the second direction.

4. The display device of claim 2, wherein the third bank opening comprises:

a 3rd-1 bank opening overlapping the 3rd-1 light-transmitting area; and a 3rd-2 bank opening overlapping the 3rd-2 light-transmitting area and spaced apart from the 3rd-1 bank opening in the first direction.

5. The display device of claim 4, wherein the third light-transmitting area is an area through which blue light passes.

6. The display device of claim 1, wherein each of the first light-transmitting area and the second light-transmitting area is an area through which one of red light and green light passes.

7. The display device of claim 1, wherein the color conversion panel further comprises a first cover part disposed in the 1st-3 bank opening, extending in the second direction, and connected to the bank.

8. The display device of claim 7, wherein the first cover part and the bank include a same material.

9. The display device of claim 1, wherein the first light-transmitting area comprises:

a 1st-3 light-transmitting area spaced apart from the 1st-2 light-transmitting area in the first direction; and a 1st-4 light-transmitting area spaced apart from the 1st-3 light-transmitting area in the first direction, and wherein the first bank opening comprises:

a 1st-4 bank opening overlapping the 1st-3 light-transmitting area;

a 1st-5 bank opening overlapping the 1st-4 light-transmitting area; and a 1st-6 bank opening connecting the 1st-4 bank opening and the 1st-5 bank opening to each other.

10. The display device of claim 9, wherein the first bank opening further comprises a 1st-7 bank opening connecting the 1st-2 bank opening and the 1st-4 bank opening to each other.

11. The display device of claim 10, wherein the 1st-7 bank opening has a greater length in the second direction than a length of at least one of the 1st-2 bank opening and the 1st-4 bank opening in the second direction.

12. The display device of claim 1, wherein the first light-emitting element, the second light-emitting element, and the third light-emitting element emit light of a same color.

13. The display device of claim 1, wherein the color conversion panel further comprises a functional layer comprising a first quantum dot layer disposed in the first bank opening, a second quantum dot layer disposed in the second bank opening, and a transmission layer disposed in the third bank opening.

14. An electronic device comprising:

a display panel comprising a first light-emitting element; and a color conversion panel disposed on the display panel, wherein the color conversion panel comprises:

an upper substrate comprising a first light-transmitting area overlapping the first light-emitting element;

a color filter layer disposed under the upper substrate and comprising a first color filter overlapping the first light-transmitting area; and a bank disposed under the color filter layer and comprising a first bank opening overlapping the first light-transmitting area, wherein the first light-transmitting area comprises a 1st-1 light-transmitting area and a 1st-2 light-transmitting area spaced apart from the 1st-1 light-transmitting area in a first direction, and the first bank opening comprises a 1st-1 bank opening overlapping the 1st-1 light-transmitting area, a 1st-2 bank opening overlapping the 1st-2 light-transmitting area, and a 1st-3 bank opening connecting the 1st-1 bank opening and the 1st-2 bank opening to each other, and wherein the 1st-3 bank opening has a greater length in a second direction crossing the first direction than a length of at least one of the 1st-1 bank opening and the 1st-2 bank opening in the second direction.

15. The electronic device of claim 14, wherein the color conversion panel further comprises a first cover part disposed in the 1st-3 bank opening, extending in the second direction, and connected to the bank.

16. The electronic device of claim 15, wherein the first cover part and the bank include a same material.

17. The electronic device of claim 14, wherein the first light-transmitting area comprises:

a 1st-3 light-transmitting area spaced apart from the 1st-2 light-transmitting area in the first direction; and a 1st-4 light-transmitting area spaced apart from the 1st-3 light-transmitting area in the first direction, and wherein the first bank opening comprises:

a 1st-4 bank opening overlapping the 1st-3 light-transmitting area;

a 1st-5 bank opening overlapping the 1st-4 light-transmitting area; and a 1st-6 bank opening connecting the 1st-4 bank opening and the 1st-5 bank opening to each other.

18. The electronic device of claim 17, wherein the first bank opening further comprises a 1st-7 bank opening connecting the 1st-2 bank opening and the 1st-4 bank opening to each other.

19. The electronic device of claim 18, wherein the 1st-7 bank opening has a greater length in the second direction than a length of at least one of the 1st-2 bank opening and the 1st-4 bank opening in the second direction.

20. The electronic device of claim 14, wherein the color conversion panel further comprises a functional layer comprising a first quantum dot layer disposed in the first bank opening.

* * * * *